United States Patent [19]
Utsumi et al.

[11] Patent Number: 5,583,058
[45] Date of Patent: Dec. 10, 1996

[54] INFRARED DETECTION ELEMENT ARRAY AND METHOD FOR FABRICATING THE SAME

[75] Inventors: Yoshikazu Utsumi; Akira Yamada; Masatomi Okumura; Hisao Watarai; Ken Sato; Takehiko Sato; Yuichi Sakai, all of Amagasaki, Japan

[73] Assignee: Mitsubishi Denki Kabushiki Kaisha, Tokyo, Japan

[21] Appl. No.: 244,079

[22] PCT Filed: Sep. 16, 1993

[86] PCT No.: PCT/JP93/01328

§ 371 Date: May 17, 1994

§ 102(e) Date: May 17, 1994

[87] PCT Pub. No.: WO94/07115

PCT Pub. Date: Mar. 31, 1994

[30] Foreign Application Priority Data

Sep. 17, 1992 [JP] Japan .................................. 4-247722
Jan. 27, 1993 [JP] Japan .................................. 5-011438

[51] Int. Cl.$^6$ ................................ H01L 27/14; G01J 5/02
[52] U.S. Cl. ................................................ 437/3; 250/338.4
[58] Field of Search ................................ 437/2, 3, 5, 927, 437/65, 66, 93, 228; 148/DIG. 73, DIG. 80; 156/647.1; 250/338.4, 338.3, 332; 257/466

[56] References Cited

U.S. PATENT DOCUMENTS

| | | | |
|---|---|---|---|
| 3,893,228 | 7/1975 | George et al. | 437/93 |
| 4,593,456 | 6/1986 | Cheung | 250/338 |
| 4,675,525 | 6/1987 | Amingual et al. | 437/3 |
| 5,095,211 | 5/1992 | Kimata . | |
| 5,118,944 | 6/1992 | Mori et al. | 250/338.4 |
| 5,120,664 | 9/1992 | Murotani | 437/3 |
| 5,193,911 | 3/1993 | Nix et al. | 437/3 |
| 5,270,258 | 12/1993 | Yoshida | 437/228 |
| 5,293,041 | 3/1994 | Kruse, Jr. | 250/338.3 |
| 5,297,719 | 3/1994 | Hirai et al. | 437/228 |
| 5,369,280 | 11/1994 | Liddiard | 250/338.4 |
| 5,397,897 | 3/1995 | Komatsu et al. | 250/338.4 |

FOREIGN PATENT DOCUMENTS

| | | | |
|---|---|---|---|
| 61-36967 | 2/1986 | Japan | 437/3 |
| 63-136566 | 6/1988 | Japan | 257/466 |
| 1-94227 | 4/1989 | Japan | 250/338.3 |
| 1-42418 | 6/1989 | Japan | 250/338.4 |
| 2-165672 | 6/1990 | Japan | 257/466 |
| 2-205730 | 8/1990 | Japan | 250/338.3 |
| 2246907 | 8/1990 | Japan | 437/3 |
| 3-212979 | 9/1991 | Japan | 257/466 |
| 4-6424 | 1/1992 | Japan | 250/338.3 |
| 5-187917 | 7/1993 | Japan | 250/338.4 |

OTHER PUBLICATIONS

"Status of Uncooled Infrared Imagers", Robert E. Flannery and James E. Miller, CECOM Night Vision and Electro-Optics Directorate, Infrared Technology Division, Ft. Belvoir VA, SPIE vol. 1689 Infrared Imaging Systems (1992) /379.
"Ferroelectric Ceramics for Infrared Detection", R. Watton and M. A. Todd, Royal Signals and Radar Establishment, Great Malvern, Worcs, U.K., Br. Ceram. Proc., No. 41, 205-217 (1989).

*Primary Examiner*—Tom Thomas
*Assistant Examiner*—S. Mulpuri
*Attorney, Agent, or Firm*—Burns, Doane, Swecker & Mathis, LLP

[57] ABSTRACT

An object of the present invention is to provide a highly integrated infrared detecting element array having infrared detecting elements which are disposed at a high density and have a low heat capacity each. An insulator film 2 is provided on a silicon substrate 1 having upper surface in a {100} plane; opening portions are defined by etching right-angled triangular portions defined at four corners of each of right-angled quadrilaterals arranged in matrix array and enclosed by two orthogonally crossing pairs of parallel linear portions extending on the insulator film a pyramid cavity; 3 is defined into the silicon substrate underlying the insulator film 2 by anisotropically etching the silicon substrate; and infrared detecting elements are formed on the insulator film 2.

6 Claims, 17 Drawing Sheets

FIG. 17
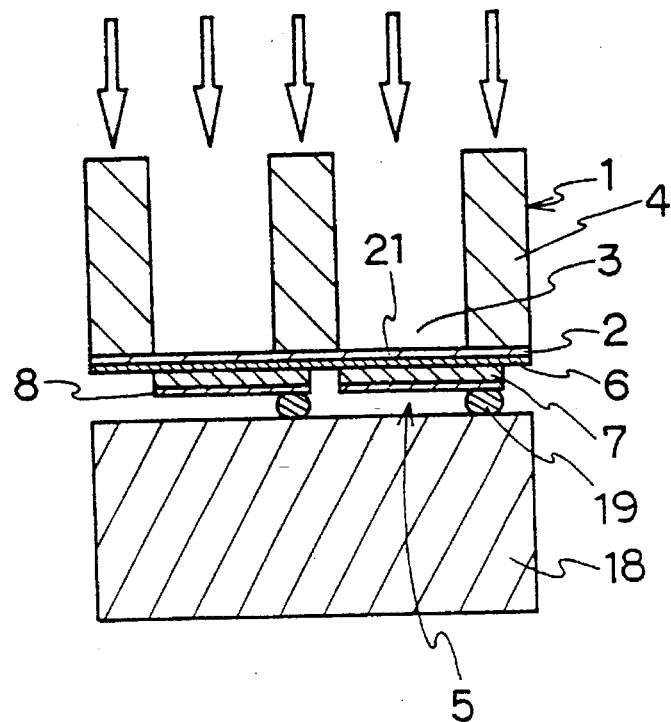
FIG. 17(a)
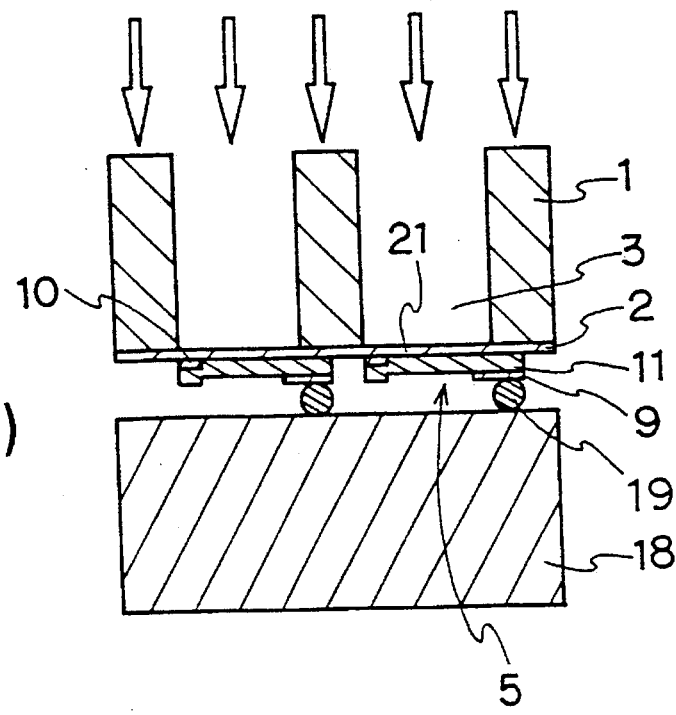
FIG. 17(b)

INFRARED DETECTION ELEMENT ARRAY AND METHOD FOR FABRICATING THE SAME

DESCRIPTION

1. Technical Field

The present invention relates to an infrared detecting element array utilizing electrical characteristics varied by heat such as pyroelectricity, an electric resistance varied according to temperature and thermoelectromotive force, and to a method for fabricating such infrared detecting element array. More particularly, it relates to a highly integrated infrared detecting element array with less crosstalk having a two-dimensional structure of infrared detecting elements of which temperature rises easily with less heat and to a method for fabricating the same.

2. Background Art

Conventional infrared detecting devices are categorized as photo-detectors and thermal detectors. The photo-detectors assure high precision and high responsiveness and allows the size thereof to be scaled down since they are capable of employing detecting elements each reduced in size. However, the photo-detectors need to be cooled down to a temperature lower than 0° C. and hence suffer a drawback of costly running when in use. The thermal detectors are less sensitive and less responsive than the photo-detectors but offer an advantage that cooling is unnecessary. The thermal detectors include pyroelectric type, capacitor type (driven with alternating current), resistor type and thermoelectromotive force type. Technical objectives common to the thermal detectors are:

(1) to enhance the sensitivity to heat;

(2) to reduce the heat capacity of the detectors utilizing a temperature rise caused by infrared rays;

(3) to prevent heat transfer to elements adjacent to the element in operation (to reduce crosstalk) in order to obtain a clear image;

(4) to facilitate the coupling of the detector to a transistor for amplification, signal processing or the like;

(5) to constitute the detector strong enough not to be damaged when it is integrated into a package or the like.

Among the thermal detectors, the pyroelectric type detector has a relatively high sensitivity. Pyroelectric type detectors in the form of array which have so far been put into practice are fabricated by defining grooves on a thin wafer of pyroelectric ceramic or by cutting such wafer into small pieces and arranging them in an array. For example, one disclosed in Bulletin of Ceramic Process, No. 41, 1989, pp. 205–217 is of a configuration formed by defining grooves into a pyroelectric ceramic wafer to form a chip, providing an infrared absorption layer on the chip and forming electrodes on the lower side of the chip. This configuration is characterized in that the detector is soldered to a silicon multiplexer by the pad provided on each lower electrode.

Such configuration, however, involves disadvantages such as:

(1) difficulty in reducing the heat capacity because of the use of a thin ceramic wafer;

(2) weakness against severe thermal conditions because of a difference in thermal expansion coefficient between the ceramic and the silicon used for the multiplexer;

(3) limitation in down scaling because of the use of chipped ceramic.

An approach being considered to reduce the heat capacity is to employ a thin film for forming infrared detecting elements. Japanese Unexamined Patent Publication No. 129677/1988 discloses a structure wherein a film having pyroelectric elements arranged is held by an MgO substrate at both ends thereof. Method of forming this structure includes forming a pyroelectric thin film on a single-crystalline MgO substrate, forming a multiplicity of separate thin metal electrode films on the pyroelectric thin film, and partially removing the portion of the substrate in contact with the pyroelectric film to leave the pyroelectric film bridging over the removed portion. However, such a structure wherein the substrate is etched in a portion under the pyroelectric film to hold the pyroelectric film is poor in strength. Japanese Unexamined Patent Publication No. 94227/1989 discloses an art of cutting a through-hole into a semiconductor substrate from the lower side thereof. With this method, however, the use of a p-type silicon substrate makes it impossible to etch anisotropically from the lower side of the substrate to have a directionality. Hence, isotropic etching must be effected, resulting in a problem of a large etched region extending even under the mask defining an opening for etching. Japanese Unexamined Patent Publication No. 136038/1989 discloses a method including defining a groove into a substrate, filling the groove with spacer, forming a supporting film and forming on the supporting film a pyroelectric film. This method, however, has a disadvantage that it is difficult to make the surface of spacer flush with the substrate surface. Further, Japanese Unexamined Patent Publication No. 212979/1991 discloses an example of an infrared detector having a semiconductor structure wherein a diaphragm structure is provided on the main surface and anisotropic etching is employed. This structure, however, has disadvantages that a cleaning solution is hard to penetrate into portions etched and that the degree of freedom in device design is restricted due to a groove for etching centrally lying.

Among the thermal infrared detectors, the pyroelectric type detector offers a high sensitivity but requires a shutter for obtaining an image of a stationary object since electric charge disappears with a lapse of time after the occurrence of a change in temperature. On the other hand, those of the resistor type, capacitor type, thermoelectromotive force type and the like have an advantage of requiring no shutter since they utilize a characteristic difference due to temperature. Nevertheless, the capacitor type detector is adapted to detect infrared rays utilizing a high frequency, resulting in a complicated circuit, while the thermoelectromotive force type detector requires the provision of detection junction and cold junction for each element, resulting in a problem of increased area.

DISCLOSURE OF THE INVENTION

An object of the present invention is to provide an infrared detecting element array with less heat capacity and less crosstalk which includes a multiplicity of thermal-type infrared detecting elements arranged in array, each being constituted by a thin film, a method for fabricating the same, and an infrared detecting element array coupled to a semiconductor device for signal processing.

An infrared detecting element array according to the present invention comprises a plurality of infrared detecting elements which are two-dimensionally arranged on a semiconductor substrate; a cavity lying under each of the infrared detecting elements; a lattice part which is two-dimensionally continuously disposed on the semiconductor substrate and encloses the cavity; and bridge parts connecting each of the infrared detecting elements to the lattice part.

Preferably, the infrared detecting element array of the present invention further comprises an insulator film which is two-dimensionally continuously disposed on the semiconductor substrate, each of the infrared detecting elements being disposed on the insulator film, the insulator film constituting at least a portion of the lattice part, one of bridge parts of the insulator film having an interconnection wire.

Further preferably, in the infrared detecting element array of the present invention the insulator film is provided as defining a gap portion between a portion thereof underlying each of the infrared detecting elements and a surface of the semiconductor substrate, and the cavity comprises the gap portion and an etched portion resulting from etching against a surface of the semiconductor substrate bordering the gap portion.

In the infrared detecting element array of the present invention, desirably, the semiconductor substrate is a silicon substrate of which upper surface extends in (100) plane thereof, the lattice part has a top surface defined by straight lines parallel to a {111} plane or those parallel to a {110} plane, and the cavity is of a shape of four upside-down pyramids combined.

Further, in the infrared detecting element array of the present invention, desirably, the cavity lying under each of the infrared detecting elements extends through the semiconductor substrate substantially vertically to a surface of the semiconductor substrate down to a lower surface thereof.

Preferably, the infrared detecting element array of the present invention further comprises transistors for signal processing each connected to and disposed adjacent to or below each of the infrared detecting elements, and interconnection wiring films extending longitudinally and transversely to the transistors for selectively driving the transistors.

In the infrared detecting element array of the present invention the infrared detecting elements each may be connected to both a transistor for signal processing and a device for scanning which are disposed on the semiconductor substrate adjacent to an end of each row or column of the infrared detecting elements.

Further, in the infrared detecting element array of the present invention the infrared detecting elements each may be electrically connected to a transistor for signal processing by way of a bump of a low-melting-point metal disposed on a skeleton of the lattice part.

A method for fabricating an infrared detecting element array comprises the steps of: forming a substrate isolating insulator film on a semiconductor substrate; forming on the substrate isolating insulator film a plurality of dummy films disposed two-dimensionally; forming a lattice film on a surface of the substrate isolating insulator film on which the dummy films are absent to define a lattice part; forming an insulating film on both the dummy films and the lattice part; forming an infrared detecting element portion comprising an electrode film and an infrared detecting element film on the insulating film at a location coincident with each of the dummy films; defining an opening portion in the insulating film at a portion thereof on which the infrared detecting element portion is not formed, the opening portion extending down to each of the dummy films; and removing the dummy films through the opening portion to define a cavity under the infrared detecting element portion.

The present invention further provides a method for fabricating an infrared detecting element array comprising the steps of: forming a lattice film on a semiconductor substrate; opening a plurality of holes into the semiconductor substrate having the lattice film from an upper surface thereof to define the remaining lattice film as a lattice part; filling each of the holes with a dummy film; forming an insulator film on both the lattice part and the dummy film; forming an infrared detecting element portion comprising an electrode film and an infrared detecting element film on the insulator film at a location coincident with the dummy film; defining an opening portion into the insulator film at a portion thereof on which the infrared element portion is not formed, the opening portion extending down to the dummy film; and removing the dummy film through the opening portion to define a cavity under the infrared detecting element portion.

In the method of the present invention, preferably, the semiconductor substrate is a silicon substrate of which upper surface extends in a {100} plane thereof, the lattice part has a top surface defined by straight lines parallel to a {111} plane and those parallel to a {110} plane, and the cavity is etched in the silicon substrate anisotropically after the formation of the opening portion.

The present invention still further provides a method for fabricating an infrared detecting element array comprising the steps of: providing an insulator film on a surface of a silicon substrate of which upper surface extends in a {100} plane thereof; defining right-angled quadrilaterals arranged in matrix array each defined by two orthogonally crossing pairs of parallel linear portions extending on the insulator film so that right-angled triangles defined at four corners of each of the right-angled quadrilaterals each have the two sides making a right angle therebetween which are made parallel to a {111} plane of the silicon substrate and each have the hypotenuse extending parallel to a {010} or a {001} plane and etching the insulating film to remove the right-angled triangles to define opening of the insulator film; etching anisotropically to form four pyramid-shaped cavities in the silicon substrate through the opening so that a cross-shaped portion is retained which connects each pair of opposite vertexes of a quadrilateral defined by the hypotenuses of the four right-angled triangles; and forming an infrared detecting element on the insulator film in the latter quadrilateral.

In the method of the present invention, preferably, the insulator film on the silicon substrate has a slit parallel to a {100} plane in addition to the opening shaped right-angled triangular and defined at the four corners.

Further, in the method of the present invention, preferably, the etching against the silicon substrate includes prolonged anisotropic etching or anisotropic etching followed by etching using an isotropic etchant or an etchant poor in anisotropy for etching the unetched cross-shaped portion lying under the insulator film thereby defining a cavity extending under the insulator film in overall infrared detecting element forming portion, and the insulator film in each of the quadrilaterals is supported at bridge portions defined at vertexes thereof by unetched portions of the silicon substrate, the infrared detecting element being formed on the insulator film in each of the quadrilaterals.

The present invention still further provides a method for fabricating an infrared detecting element array comprising the steps of: providing an insulator film on one side of a silicon substrate having a main surface extending in a {110} plane thereof; forming an alkali-proof film on the other side of the silicon substrate; etching the alkali-proof film so as to retain it in polygonal frames reticularly continued which are defined by two kinds of straight lines including lines extending parallel to a {111} plane of the silicon substrate; etching the silicon substrate up to the insulator film formed on the one side the silicon substrate with use of the reticular alkali-proof film etched as a mask; and forming infrared detecting elements on the insulator film.

In the present invention, each infrared detecting element disposed above the semiconductor substrate contacts the semiconductor substrate by way of the bridge parts only, thereby substantially reducing the heat capacity of each detecting element. In addition the infrared detecting element array of the present invention is of a structure having each detecting element of which overall perimeter is substantially enclosed by space. Hence, it is possible to obtain an infrared detecting element having enhanced heat insulative properties, i.e., enhanced sensitivity to feeble heat of infrared rays, assuring clear image signals in imaging application.

Further, each infrared detecting element is coupled to a signal processing transistor disposed on the semiconductor substrate adjacent to or below the element, or coupled to a signal processing transistor fabricated on a semiconductor having a thermal expansion coefficient equal to that of the semiconductor substrate by means of a bump. This assures the infrared detecting element array of enhanced reliability.

BRIEF DESCRIPTION OF THE DRAWINGS

FIGS. 17(a) and (b) are explanatory views illustrating another embodiment of an infrared detecting element array coupled to signal processing transistors according to the present invention.

BEST MODE FOR CARRYING OUT THE INVENTION

EXAMPLE 1

Figure 1A:
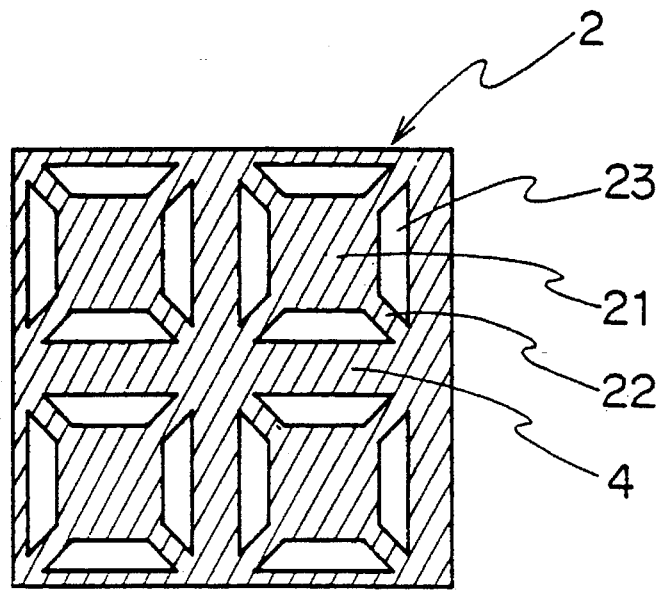
FIGS. 1(a) to 1(c) are explanatory plan views each showing part of an embodiment of an infrared detecting element array according to the present invention with infrared detecting elements and circuit parts omitted.
Figure 1B:
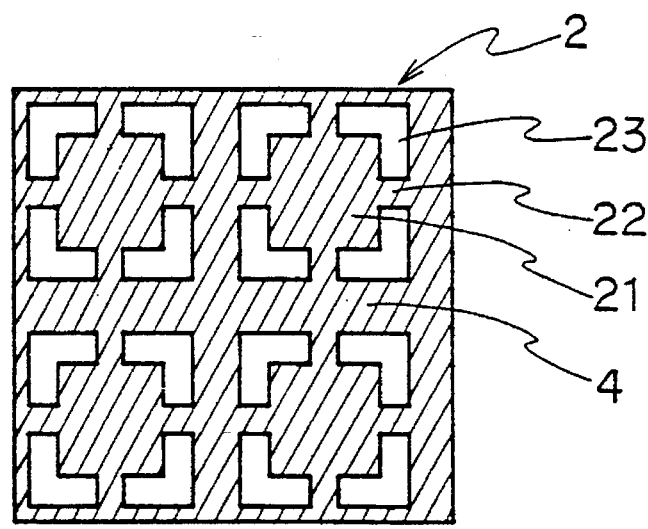
Figure 1C:
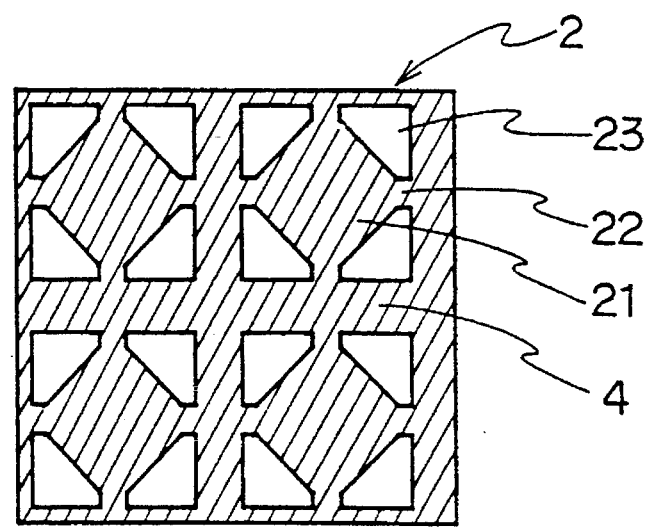

FIGS. 1(a) to 1(c) are explanatory plan views each showing part of an embodiment of an infrared detecting element array according to the present invention with infrared detecting elements and circuit parts omitted. In FIG. 1, denoted at numeral 4 is a lattice part, at numeral 21 an infrared detecting element forming portion, at numeral 22 a bridge part, and at numeral 23 an opening portion. The portion underlying the detecting element forming portion 21 and bridge part 22 is made hollow, and the lattice part 4, detecting element forming portion 21 and bridge part 22 have a common insulator film 2. The lattice part 4 is shaped quadrangular, and the detecting element forming portion 21 is also shaped quadrangular. In embodiment (a) the four corners of the detecting element forming portion 21 are connected to the four corners of the quadrangular lattice part 4 through respective bridge parts 22; in embodiment (b) the middle portion of each side of the quadrangular detecting element portion is connected to the middle portion of each side of the quadrangular lattice part 4; and in embodiment (c) the four corners of the detecting element forming portion 21 are each connected to the middle portion of each side of the quadrangular lattice part 4.

The structures shown in FIG. 1 according to the present invention are those having each infrared detecting element on an insulator film, the portion underlying the insulator film being etched. Three methods are employed to impart the etching with directionality. The first one includes making an easy-to-etch layer protuberant in a dotted fashion on a silicon substrate, forming an etch-resistant insulator film 2 thereover, and etching the portion underlying the insulator film 2. The second one includes etching anisotropically the portion underlying the insulator film out of a silicon substrate. The third one is an eclectic method of the first and second ones. The first method can also make the lattice part 4 protuberant. With the second method the lattice part 4 is a non-etch portion of the substrate.

Figure 2A:
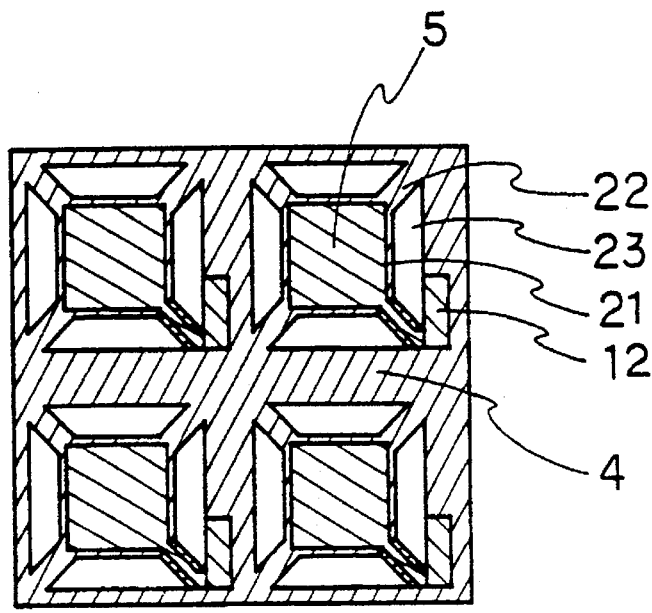
FIGS. 2(a) to 2(c) are explanatory plan views, corresponding to FIGS. 1(a) to 1(c), each showing part of an embodiment of an infrared detecting element array according to the present invention where the infrared detecting elements are formed of a pyroelectric material.
Figure 2B:
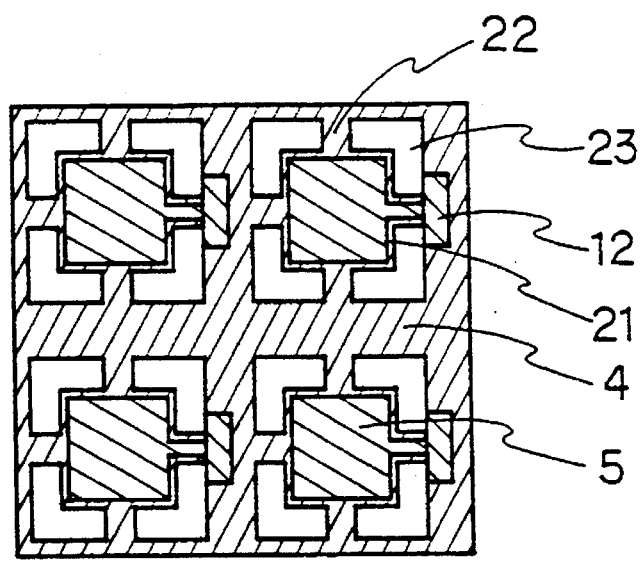
Figure 2C:
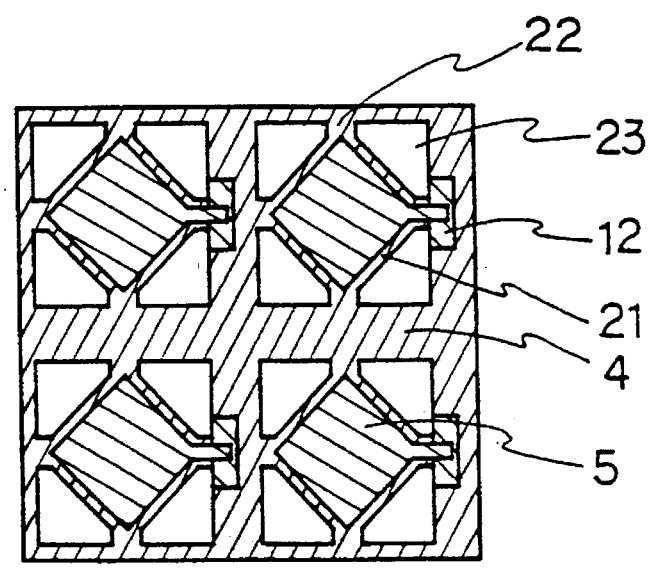
Figure 3A:
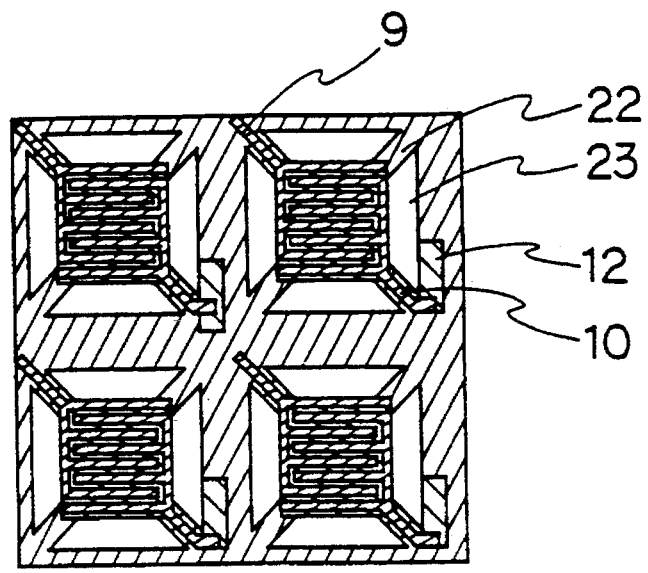
FIGS. 3(a) to 3(c) are explanatory views, corresponding to FIGS. 1(a) to 1(c), each showing part of an embodiment of an infrared detecting element array according to the present invention where the infrared detecting elements are formed of a resistor material.
Figure 3B:
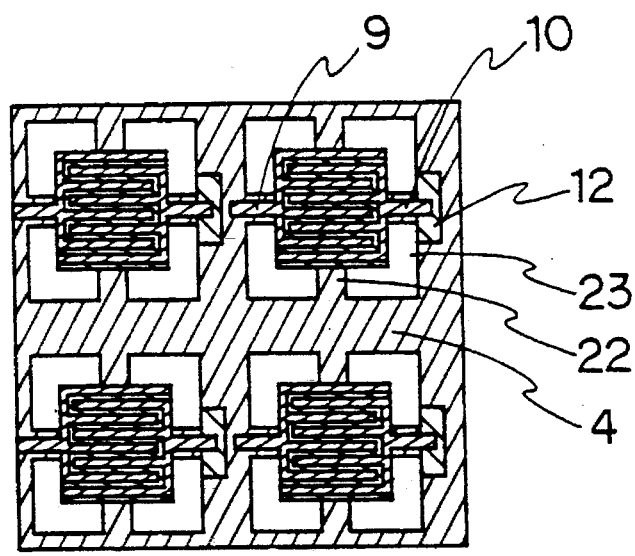
Figure 3C:
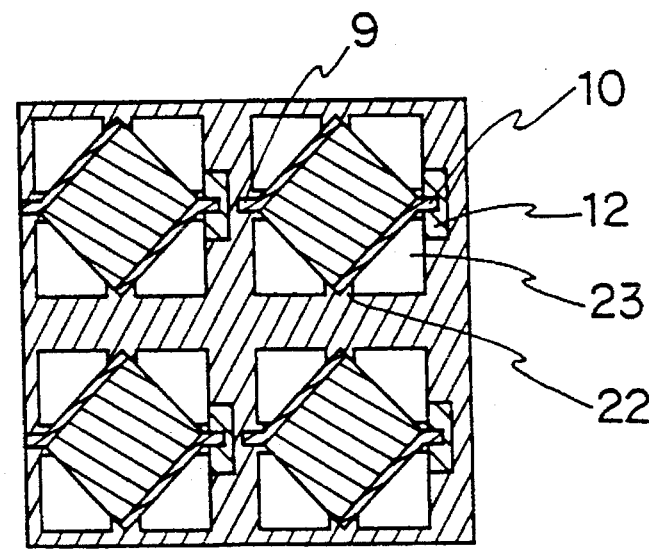
Figure 4A:
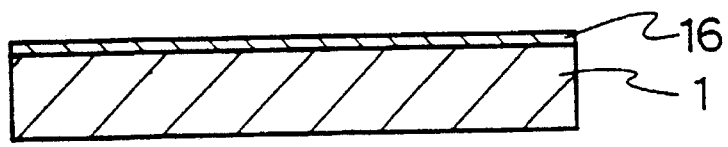
FIGS. 4(a) to 4(g) are explanatory sectional views for partially illustrating one example of a method for fabricating an infrared detecting element array according to the present invention in procedural order.
Figure 4B:
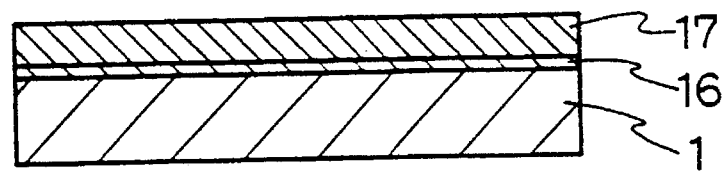
Figure 4C:
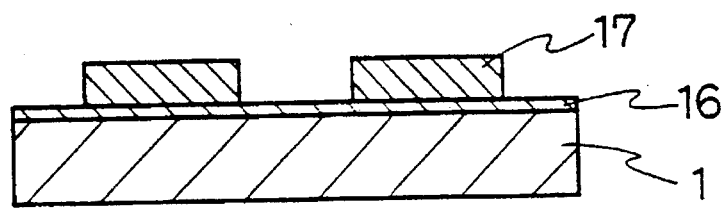
Figure 4D:
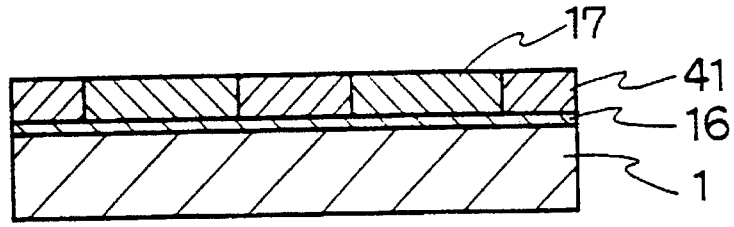
Figure 4E:
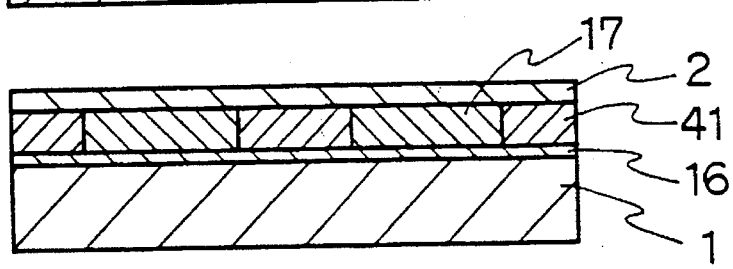
Figure 4F:
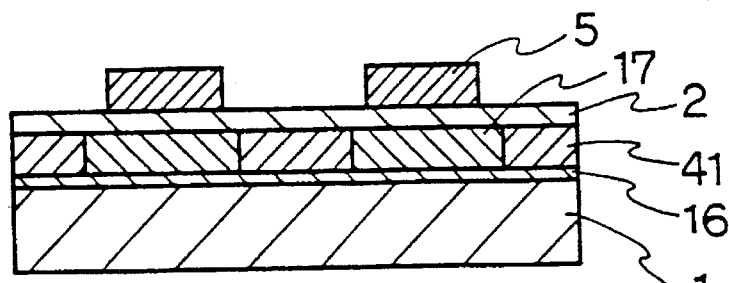
Figure 4G:
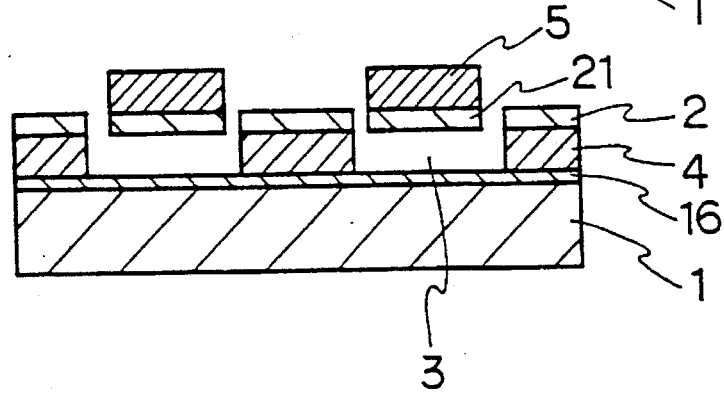
Figure 5A:
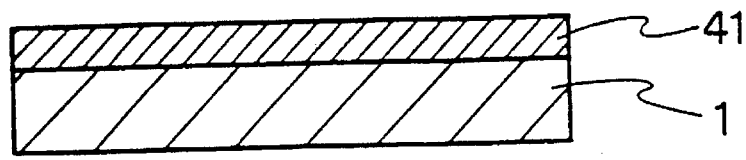
FIGS. 5(a) to 5(g) are explanatory sectional views for partially illustrating another example of a method for fabricating an infrared detecting element array according to the present invention in procedural order.
Figure 5B:
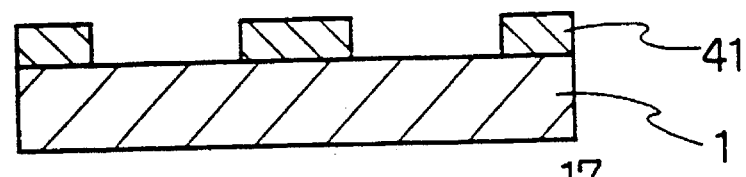
Figure 5C:
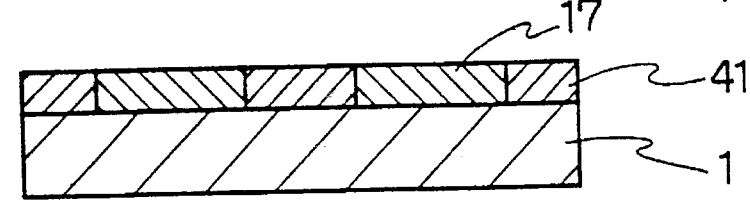
Figure 5D:
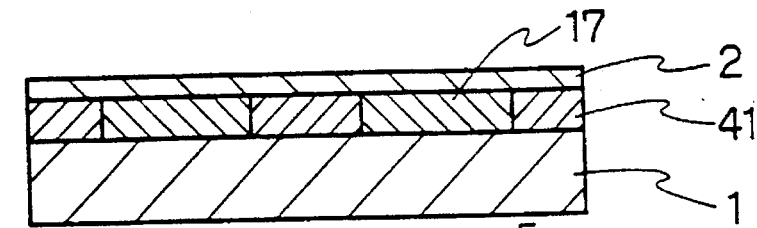
Figure 5E:
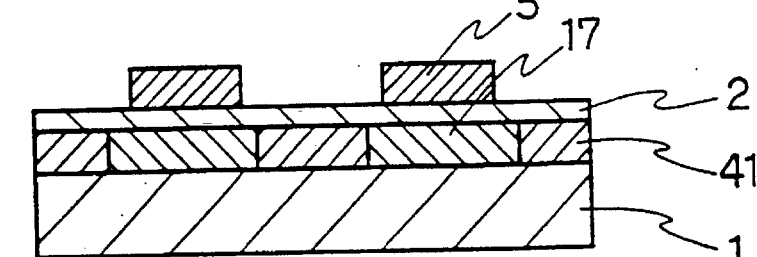
Figure 5F:
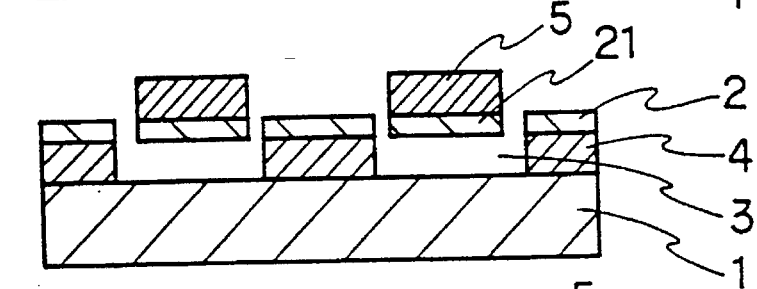
Figure 5G:
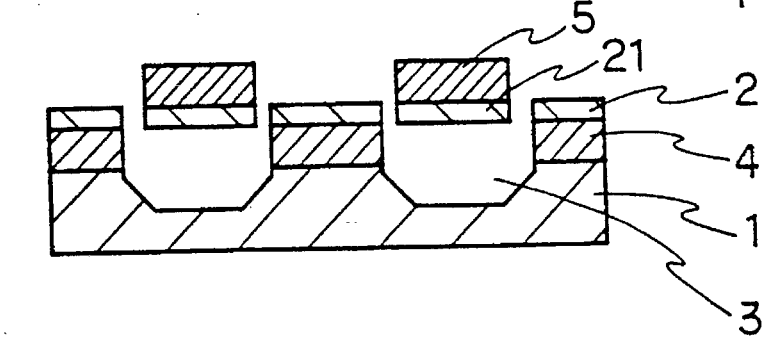

The infrared detecting elements may comprise any one of pyroelectric film, resistor film and thermoelectromotive film. Since the detecting elements are formed on a silicon substrate, it is possible to form a signal processing transistor adjacent to or below each element. FIG. 2 is a plan view of an embodiment wherein each detecting element is formed of a pyroelectric material and numeral 12 denotes a signal processing transistor. FIG. 3 illustrates an embodiment wherein each detecting element is formed of a resistor and numerals 9 and 10 denote opposite electrodes. In FIGS. 2 and 3, each signal processing transistor 12 is disposed adjacent to each detecting element 5. However, the same effect can be brought even if each transistor 12 is formed in the silicon substrate 1 underlying each detecting element 5 with a cavity intervening between the detecting element 5 and the substrate 1.

In the present invention when anisotropic etching is conducted against an n-type silicon substrate having an upper surface extending in a {100} plane or a p-type silicon substrate having a boron concentration of $10^8$ cm$^{-3}$ or less and an upper surface extending in a {100} plane, a trapezoidal or pyramid cavity will result. However, a narrow non-etched portion can be retained as the lattice part 4 under the insulator film on which the infrared detecting element 5 is to be formed and, hence, the insulator film 2 can be supported more stably.

Alternatively, the present invention may use as the silicon substrate 1 a silicon substrate of n-type or having a boron concentration of $10^8$ cm$^{-3}$ or less, of which main surface is in a {110} plane. Since such a silicon substrate can be etched to define a cavity 3 in the form of parallelogram having sides extending along a {111} plane, at least two sides of the parallelogram are etched vertically and, hence, there can be provided more cavities 3 in a smaller area than with the conventional etching techniques.

It should be noted that in the method for fabricating an infrared detecting element array according to the present invention infrared detecting elements may be formed after forming the insulator film on the substrate or after etching the substrate.

FIG. 4 is an explanatory view for illustrating one example of the method for fabricating the infrared detecting element arrays shown in plan in FIGS. 2 and 3. Denoted at numeral 1 is a silicon substrate as the semiconductor substrate, at numeral 3 a cavity, at numeral 5 are infrared detecting elements, at numeral 16 is a substrate isolating insulator film, at numeral 17 a dummy film, and at numeral 41 a lattice film. This method includes step (a) of firstly providing the substrate isolating insulator film 16 on the silicon substrate 1 using a sputtering or CVD process. In next step (b) a dummy film 17 having a high wettability against an etchant is formed on the silicon substrate 1 having the substrate isolating insulator film 16. As the dummy film 17 can advantagously be used a zinc oxide film, magnesium oxide film, metallic chromium film having a thermal expansion coefficient close to that of silicon of the substrate, or the like. The thickness of the dummy film is suitably 0.1 to 2.0 µm. If any of these materials is used for the dummy film 17, an aqueous solution of hydrochloric acid or sulfuric acid can be used as the etchant for the dummy film 17. Subsequent step (c) includes applying a photoresist, partially removing the photoresist on the dummy film 17 so as to retain every other ones of quadrilaterals defined by a plurality of pairs of parallel lines and a pair of parallel lines perpendicularly crossing the former, and removing the dummy film 17 existing in the portions from which the photoresist has been removed. Following step (d) includes forming the lattice film 41 to a thickness equal to that of the dummy film 17 with the photoresist layer being retained as it is, and removing the photoresist layer together with the lattice film 41 clinging thereto. In this case silicon oxide or silicon nitride can be used for the lattice film 41. Subsequent step (e) includes forming the insulator film 2 over the dummy film 17 and the lattice film 41. In this case if a photoresist is applied to a portion becoming an opening portion 23 in a later step, the insulator film 2 is not formed in the opening portion 23, and this will facilitate the removal of the dummy film 17 in the succeeding step. Next step (f) includes forming the infrared detecting element 5 on the insulator film 2 in a detecting element forming portion 21. Final step (g) includes removing the dummy film 17 through the opening portion 23 by etching with the aforementioned acid to define the cavity 3.

EXAMPLE 2

FIG. 5 is an explanatory sectional view for illustrating a process for fabricating another embodiment of an infrared detecting element array according to the present invention. The order of forming the dummy film 17 and the lattice film 41 of Example 1 is reversed in this example. First step (a) includes forming the lattice film 41 on the silicon substrate 1. Subsequent step (b) includes etching every other quadrangles of the lattice film 41 defined by a plurality of pairs of parallel lines and a pair of parallel lines perpendicularly crossing the former to expose the silicon substrate 1. Following step (c) includes forming the dummy film 17 in each quadrangle exposing the silicon substrate 1 to a thickness equal to that of the lattice film 41. The material used for the dummy film 17 is the same as in Example 1. Steps (d) through (f) in FIG. 5 are the same as those of Example 1. In Example 2, however, the silicon substrate 1 is exposed at the bottom of the cavity 3 upon completion of step (f). Therefore, if a (100) or {110} substrate of n-type or of the type having a boron concentration of $10^8$ cm$^{-3}$ or lower is used as the silicon substrate 1, anisotropic etching against the silicon substrate 1 through the opening portion 23 would be able to further enlarge the cavity 3 as shown in FIG. 5(g). In this case there can be used as the anisotropic etchant a warmed aqueous solution of KOH.

The advantage of this example resides in that the cavity 3 under the lattice part 4 and the bridge part 22 is large and, hence, the film will never contact the bottom of the cavity 3 even when vibrated.

EXAMPLE 3

Figure 6A:
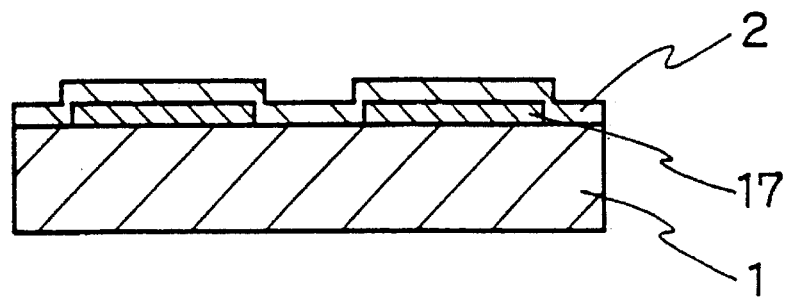
FIGS. 6(a) to 6(c) are explanatory sectional views for illustrating part of another example of a method for fabricating an infrared detecting element array according to the present invention in procedural order.
Figure 6B:
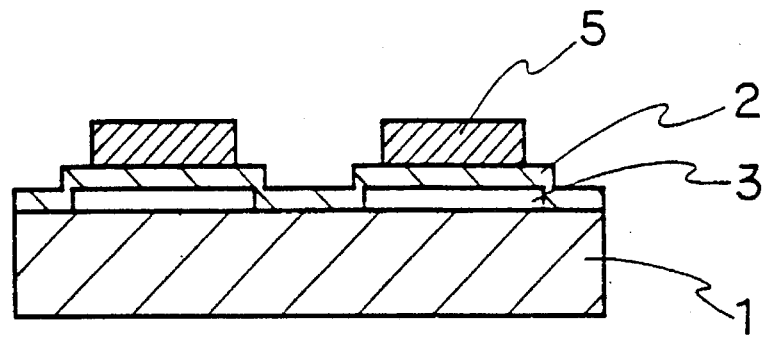
Figure 6C:
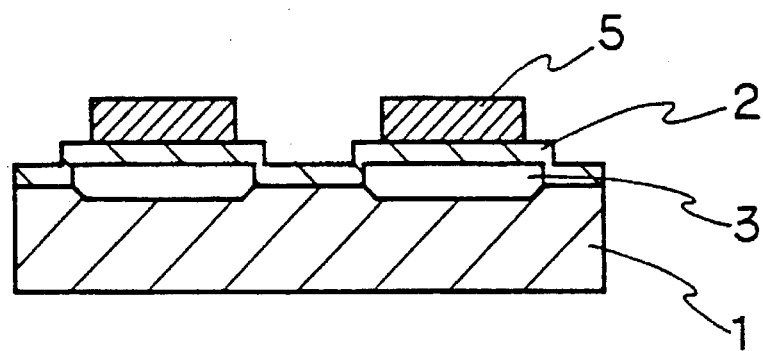
Figure 7A:
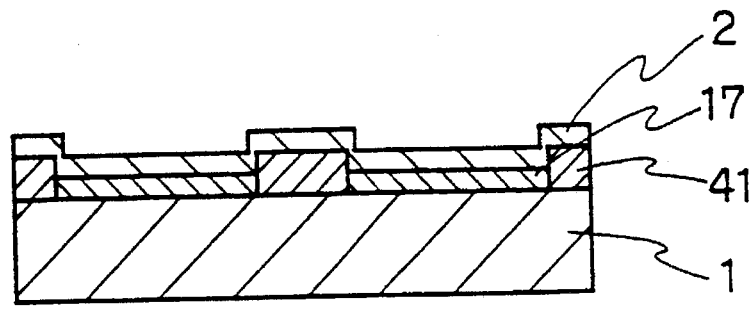
FIGS. 7(a) to 7(c) are explanatory sectional views for illustrating some steps of yet another example of a method for fabricating an infrared detecting element array according to the present invention.
Figure 7B:
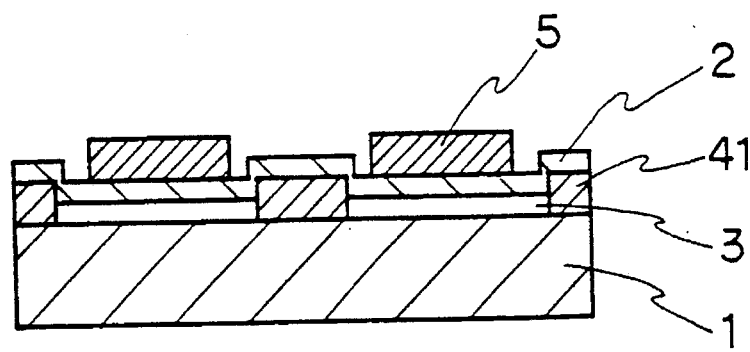
Figure 7C:
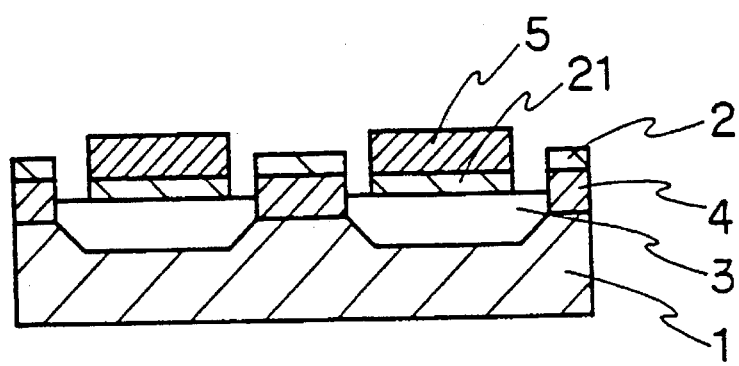

FIGS. 6 and 7 are explanatory sectional views for partially illustrating other examples of the fabrication method of the present invention. These examples include forming the dummy film 17 on the semiconductor substrate 1 in a portion intended for the formation of each infrared detecting element, providing the insulator film 2 on the dummy film 17, and etching out the dummy film 17 to form a gap between the semiconductor substrate 1 and the element forming portion of the insulator film 2, thereby facilitating etching of the semiconductor substrate 1, and forming of the cavity 3. FIG. 6 illustrates the dummy film 17 formed on the semiconductor substrate 1 without the lattice film, while FIG. 7 illustrates both the lattice film 41 and the dummy film 17 which is thinner than the lattice film 41. In FIGS. 6 and 7 each drawing (a) shows the state before the removal of the dummy film 17 and before the formation of each infrared detecting element 5; each drawing (b) shows the state after the dummy film 17 has been removed; and each drawing (c) shows the state where the silicon substrate 1 is etched. In the example of FIG. 6 the lattice film may be provided with the dummy film 17 made thicker than the lattice film. In either case the insulator film is likely to be interrupted at ends of the dummy film 17 since it becomes thin thereat. Therefore, it is preferable that the thickness of the lattice film 41 is made substantially equal to or not so different from that of the dummy film 17.

Each of the foregoing examples of the method is capable of forming any of the structures shown in plan in FIGS. 1(a) through 1(c). The following example, however, is capable of forming the structure of FIG. (c) only.

EXAMPLE 4

Figure 8A:
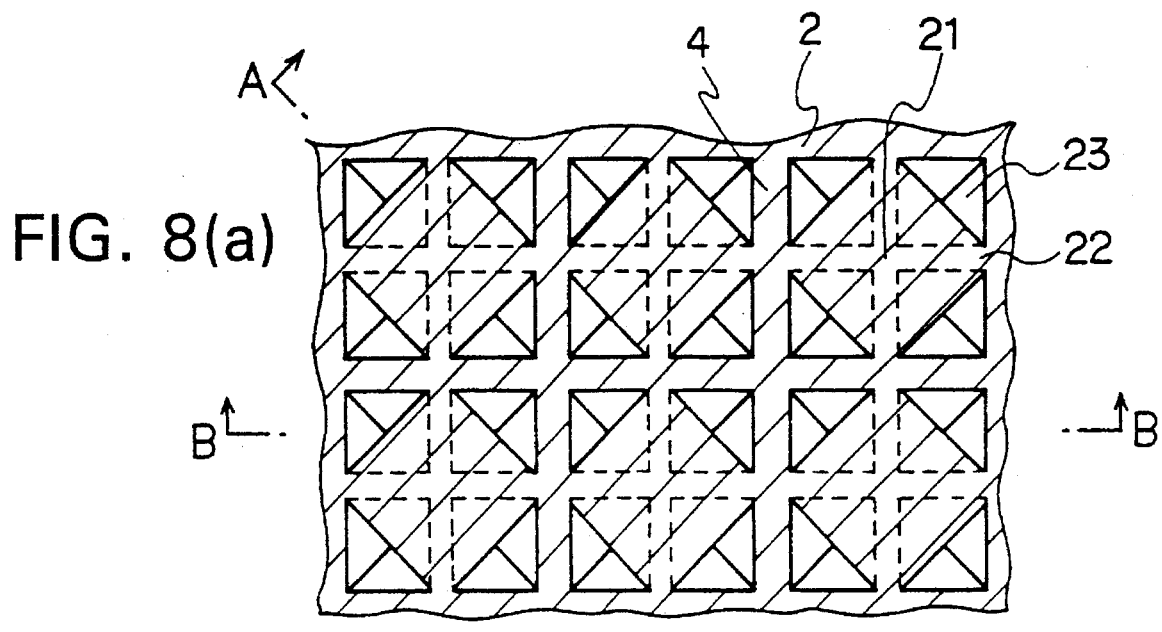
FIGS. 8(a) to 8(c) are explanatory views for illustrating the shapes of etched portions in a (100) silicon substrate and in an insulator film for the arrangement of infrared detecting elements according to the present invention.
Figure 8B:
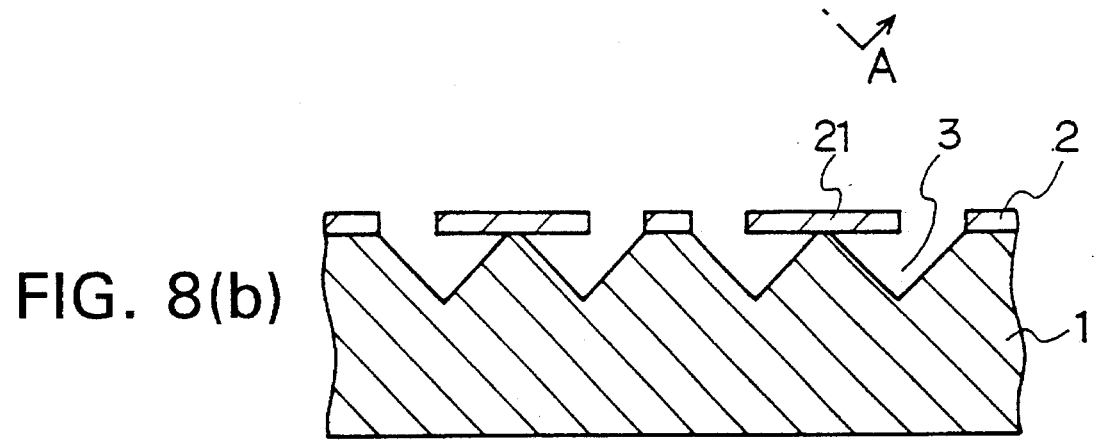
Figure 8C:
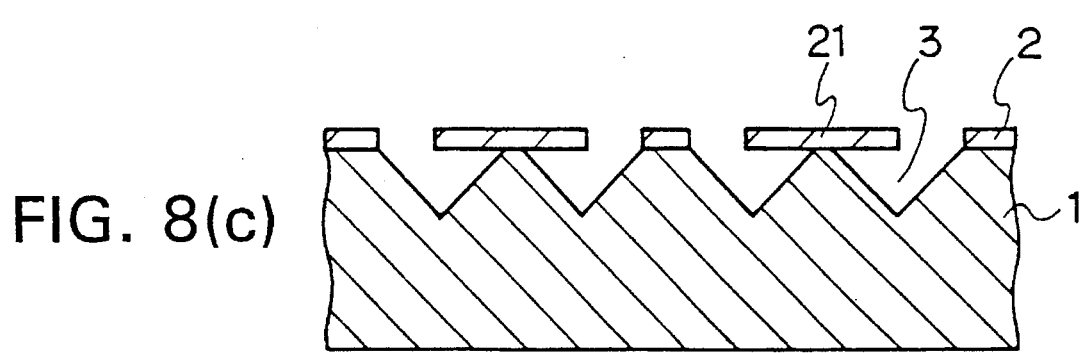

FIG. 8(a) is an explanatory plan view of a silicon substrate in the state where the cavity 3 is defined therein to form of each infrared detecting element for another embodiment of an infrared detecting element array according to the present invention; FIG. 8(b) is an explanatory sectional view taken along line A—A of FIG. 8(a); and FIG. 8(c) is an explanatory sectional view taken along line B—B of FIG. 8(a). In FIG. 8, denoted at numeral 1 is a silicon substrate having a surface in a {100} plane, at numeral 2 an insulator film formed thereon, at numeral 3 a pyramid cavity comprising four a {111} planes and defined by etching the silicon substrate 1. On the cavity 3 is left a detecting element forming portion 21 which connects to the lattice part 4 being a non-etched portion of the silicon substrate 1 through four bridge parts 22. Each infrared detecting element (not shown) is formed on the detecting element forming portion 21.

The silicon substrate 1 is usually about 0.2 to about 1.0 mm thick, and the insulator film formed on the substrate 1 is suitably formed of silicon nitride or silicon oxide.

Although the insulator film may be thin when formed of silicon nitride, the insulator film formed of silicon oxide needs to be made thick when the cavity 3 to be defined is large since the silicon oxide film is etched to some extent anisotropically with a hot aqueous solution of potassium hydroxide. Usually a preferred film thickness is 2 to 0.02 µm. The insulator film 2 is formed by sputtering process, CVD process, thermal oxidation process, alkoxide process or a like process. As the anisotropic etchant for silicon can be used an aqueous solution of an inorganic alkali such as potassium hydroxide, an aqueous solution of an organic alkali such as ethylenediamine-pyrocatechol, or the like.

The way of etching the silicon substrate 1 lying under the insulator film 2 includes etching the insulator film 2 to define an opening portion 23 and etching the silicon substrate 1 using the insulator film 2 having the opening portion 23 as a mask; or forming an alkali-proof film on the silicon substrate 1 on the side opposite to the side on which the insulator film 2 is formed, etching the alkali-proof film to form a mask, and then etching the silicon substrate 1 from the side opposite to the insulator film 2.

In Examples 4 to 6 will be described the way of etching n-type {100} silicon substrate 1 using the insulator film 2 as a mask.

Where the insulator film 2 employs silicon oxide, a photoresist is first applied onto the insulator film 2 and then subjected to an exposure to remove the photoresist in triangular regions as the opening portions 23 of the insulator film 2. The triangular regions are right-angled triangles defined at four corners of a right-angled quadrilateral defined by two straight lines extending parallel to a {111} plane on the insulator film 2 and two linear portions crossing perpendicularly to the straight lines (hereinafter the linear portions including the silicon substrate 1 and the insulator film 2 thereon is referred to as "lattice part 4" of the silicon substrate 1). The hypotenuse of each triangle extends along a {100} plane of silicon. Using the photoresist thus defining right-angled triangular holes as a mask, the insulator film 2 is etched using a mixed liquid of hydrofluoric acid and ammonium fluoride to define right-angled opening triangular opening portions 23. The insulator film 2 thus etched comprises the lattice part 4 and a quadrangle connected to the lattice part 4 at its vertexes. The quadrilateral portion of the insulator film 2 is the detecting element forming portion 21 and will be sometimes referred to also as "pad portion".

In turn, after removal of the photoresist, the silicon substrate 1 is anisotropically etched using the insulator film 2 thus etched as a mask. Where 30% potassium hydroxide aqueous solution at 70° C., for example, is used as the etchant in this anisotropic etching and the pad portion on which an element is to be formed is a quadrilateral having each side of 50 µm, a {100} plane of the silicon substrate 1 is etched and a {111} plane thereof is exposed in about 40 minutes (with this aqueous solution a {111} plane is etched at a very low rate and the etching ratio of a {111} plane to a {100} plane is about 1/400). As a result, in the silicon substrate 1 are defined cavities 3 etched in the form of pyramid and enclosed by the lattice part 4 defined by a {100} equivalent plane and an unetched portion (indicated by dotted line in FIG. 8(a)) in the form of cross connecting opposing vertical angles of the detecting element forming portion 21. The detecting element forming portion 21 is connected to the lattice part at its vertexes and supported by the narrow unetched portion in the form of cross connecting opposing vertexes of the detecting element forming portion 21.

The width of the cross-like unetched portion of the silicon substrate is desirably made as narrow as possible, preferably 0.5 to 10 µm in width.

Where a silicon nitride film is used for the insulator film 2, the silicon nitride film is first formed on the silicon substrate 1, a silicon oxide film is formed thereon, the silicon oxide film is first etched using a mixed aqueous solution of hydrofluoric acid and ammonium fluoride, and then the silicon nitride film is etched with a hot aqueous solution of phosphoric acid using the remaining silicon oxide film as a mask. If a 66% phosphoric acid aqueous solution heated to 180° C. is used, the silicon nitride film is etched to a depth of 0.2 µm in about 20 minutes. Other operations are similar to those in the case of the silicon oxide film used.

On a plurality of detecting element forming portions 21 thus formed were formed individual infrared detecting elements to complete an infrared detecting element array.

EXAMPLE 5

Figure 9A:
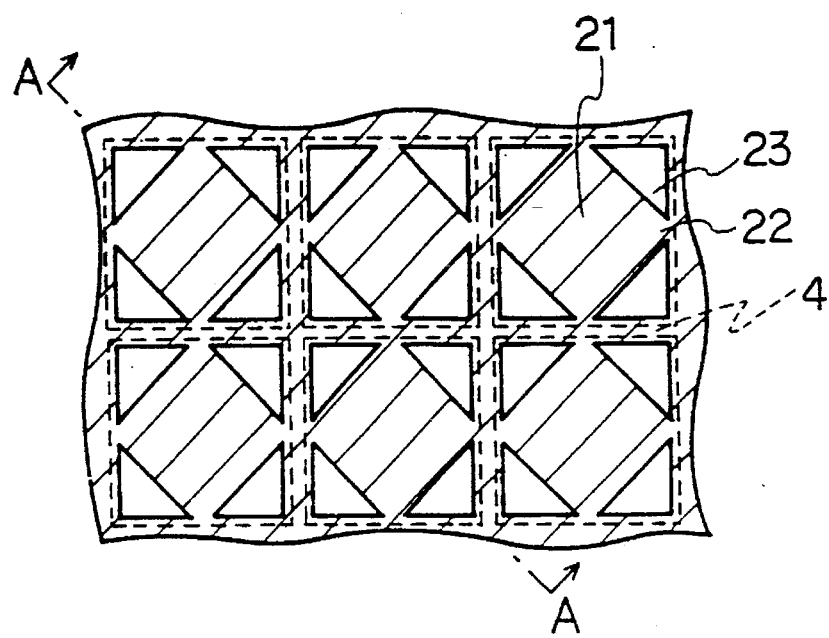
FIGS. 9 (a) and 9(b) are explanatory views for illustrating the shapes of etched portions in a (100) silicon substrate and in an insulator film for the arrangement of infrared detecting elements according to the present invention.
Figure 9B:
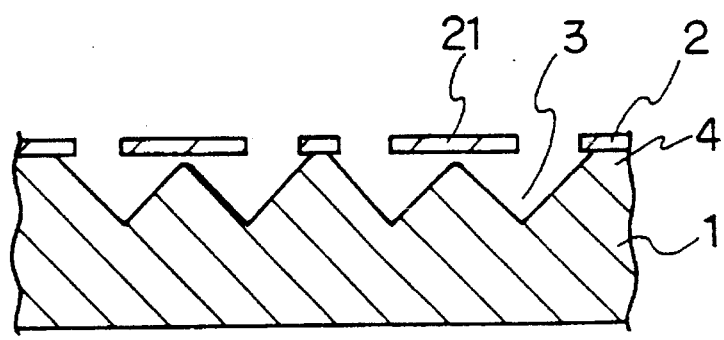

FIG. 9(a) is an explanatory plan view of the silicon substrate 1 in the state where the cavity 3 is defined therein but before the formation of each infrared detecting element for illustrating another embodiment of an infrared detecting element array according to the present invention; FIG. 9(b) is an explanatory sectional view taken along line A—A of FIG. 9(a). In FIG. 9 like numerals denote like parts of FIG. 8.

The insulator film 2 of silicon nitride is formed on a surface of the silicon substrate 1. In turn, in the same way as in Example 4 etching of the insulator film 2 and anisotropic etching of the silicon substrate 1 are carried out to define the detecting element forming portion 21 having bridge parts 22. At this time a surface of the substrate 1 is retained in the form of cross connecting bridge parts 22 crosswise which are connected to the four corners of the detecting element forming portion 21.

In turn, using an isotropic etchant of a mixed solution of hydrofluoric acid, nitric acid and acetic acid or an etchant which is not isotropic but poor in anisotropy, the cross-shaped portion of the silicon substrate 1 is etched, so that the detecting element forming portion 21 becomes a film suspended at the bridge parts 22 and the lattice part is defined therearound, as shown in FIGS. 9(a) and 9(b). In this case, instead of the isotropic etching the anisotropic etching for a prolonged time would lead to a similar result.

As described above, in etching to remove the silicon substrate 1 retained as shaped like a cross under the detecting element forming portion 21, the etching progresses as far as under the silicon nitride film of the lattice part 4 of the silicon substrate 1 but this will cause no adverse effect.

On a plurality of detecting element forming portions 21 thus formed as enclosed by the lattice part 4 of the silicon substrate 1 were formed individual infrared detecting elements to complete an infrared detecting element array.

Figure 10A:
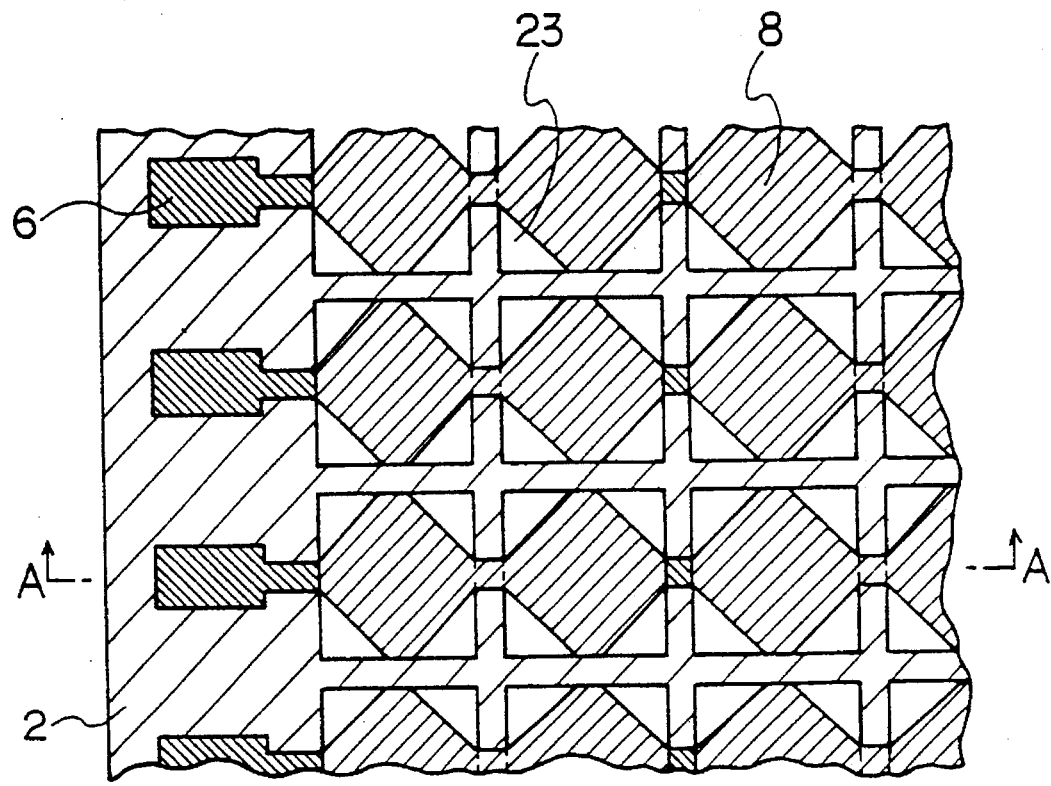
FIGS. 10(a) and (b) are explanatory views illustrating another embodiment of a pyroelectric-type infrared detecting element array according to the present invention.
Figure 10B:
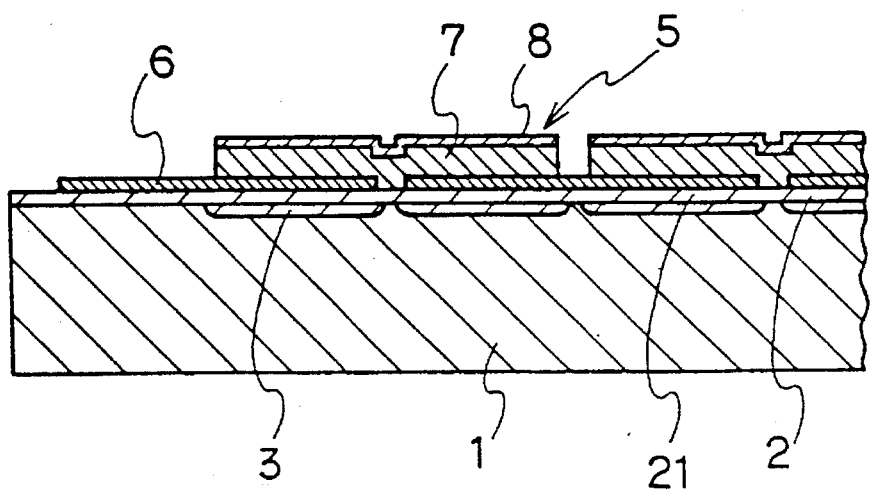

FIG. 10(a) is an explanatory plan view of an example where infrared detecting elements of pyroelectric film are formed on respective detecting element forming portions 21 shown in FIG. 9; and FIG. 10(b) is an explanatory sectional view taken along line A—A of FIG. 10(a). In FIG. 10 numerals 1–3 and 21–23 denote corresponding parts of FIG. 9, and numerals 6, 7 and 8 denote a lower electrode, pyroelectric film and upper electrode, respectively.

The upper and lower electrodes 8 and 6 can be formed by sputtering, for example, platinum, gold, nickel, chromium and aluminum.

The aforesaid pyroelectric film 7 is formed by providing, for example, $PbTiO_3$ or $Pb(Zr_{1-x}Ti_x)O_3$ on the lower electrode by sputtering process or a like process. Preferably, the pyroelectric film 7 is 10 to 0.05 µm thick and is shaped into a quadrilateral of about 200 µm×200 µm to about 10 µm×10 µm. The portion having the lower and upper electrodes 6 and 8 superposed on each other with intervening pyroelectric film 7 is formed on each detecting element forming portion 21 to become an infrared detecting element 5. In this example the infrared detecting elements 5 are connected in series. Accordingly, infrared rays incident on one element make other elements act as capacitors. In FIG. 10 electric charge is led out of a pad lying on the lefthand side of each electrode 6.

Figure 11A:
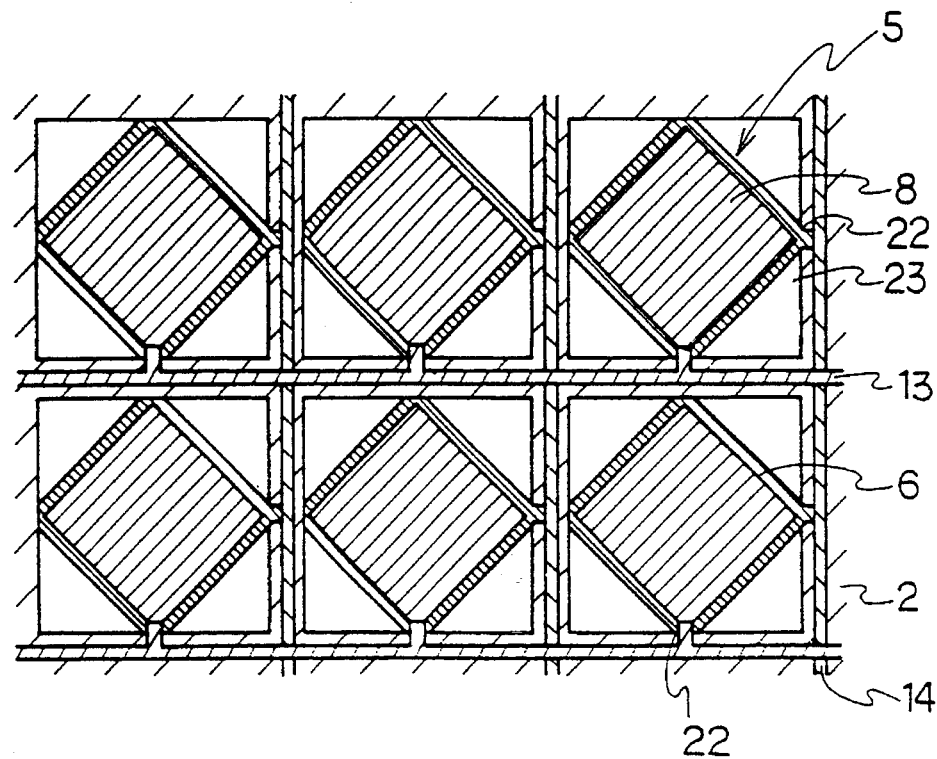
FIGS. 11(a) and 11(b) are explanatory views illustrating another embodiment of an infrared detecting element array according to the present invention.
Figure 11B:
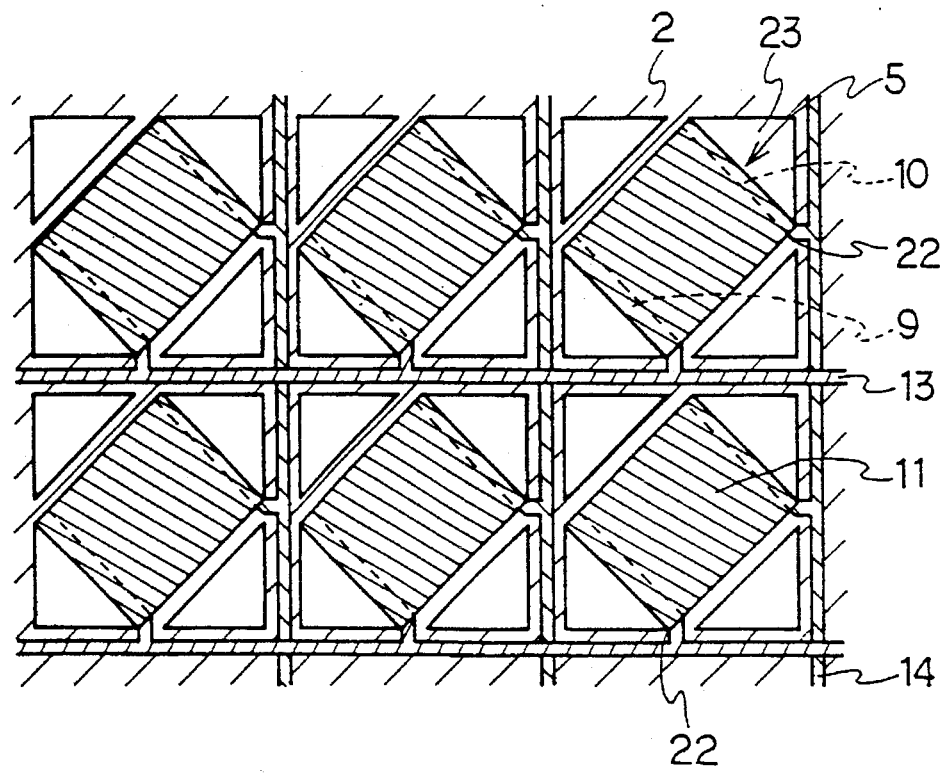

FIG. 11(a) is an explanatory view of an example where infrared detecting element of pyroelectric film is formed on each detecting element forming portion 21 shown in FIG. 2 and the upper and lower electrodes are wired longitudinally and transversely, respectively. FIG. 11(b) is an explanatory plan view of an example where an infrared detecting element of resistor film is formed on each detecting element forming portion 21 and the electrodes disposed parallel are wired longitudinally and transversely, respectively. In FIG. 11 numerals 2–8 and 21–23 denote corresponding same parts of each of the aforementioned Examples. Denoted at numeral 11 is the resistor film, at numerals 9 and 10 are the electrodes disposed parallel, at numeral 13 is a transverse interconnection wire, and at numeral 14 a longitudinal interconnection wire. The electrodes 6 and 8 or electrodes 9 and 10 are connected to the transverse and the longitudinal interconnection wires 13 and 14, respectively, through the bridge parts 22.

As the aforesaid resistor film 11 can be used an NTC thermistor film chiefly formed of a material having a large temperature coefficient such as cobalt oxide, nickel oxide and magnesium oxide, a semiconductor film such as made of SiC, and a like film. In this case, as the material of the parallel electrodes 9 and 10 can be used platinum, nickel, chromium, aluminum or the like.

A signal processing transistor and a scanning element (neither shown) may be formed around an end of each of the transverse and longitudinal wires 13 and 14 for each column, monolithically on the same substrate.

Figure 12A:
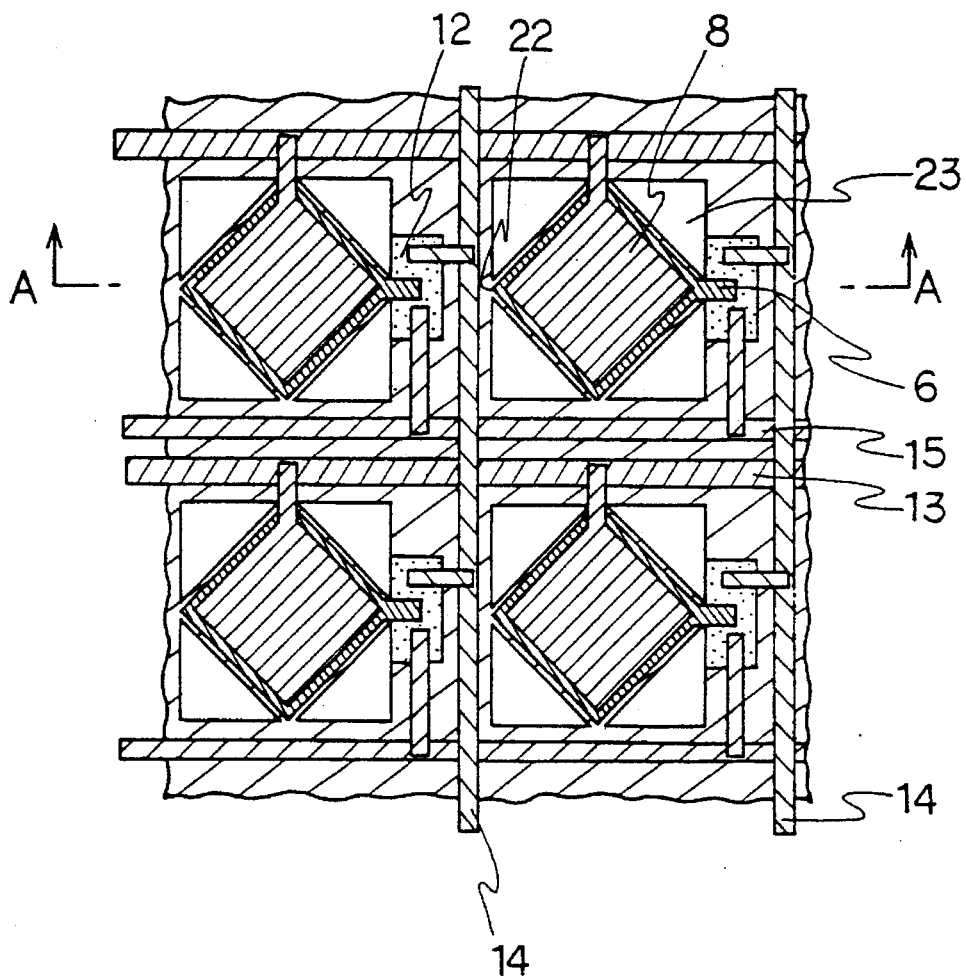
FIGS. 12(a) and 12(b) are explanatory views illustrating one embodiment of an infrared detecting element array coupled to signal processing transistors according to the present invention.
Figure 12B:
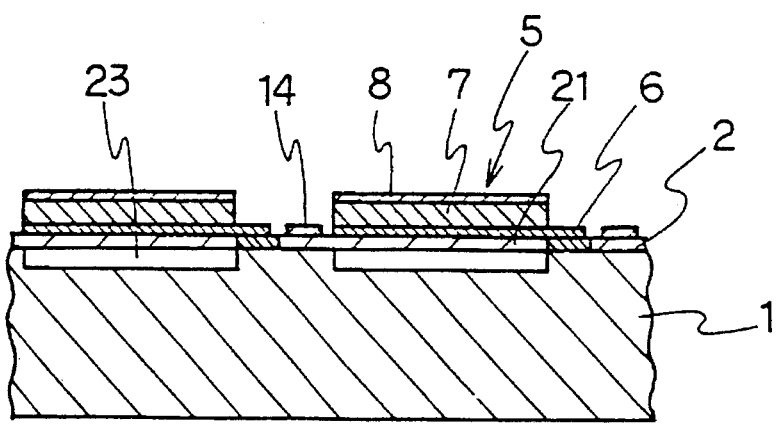

FIG. 12(a) is an explanatory plan view of an example where an infrared detecting element 5 of pyroelectric film is formed on each detecting element forming portion 21 shown in FIG. 2 and a transistor 12 is formed adjacent to each detecting element 5. FIG. 12(b) is an explanatory sectional view taken along line A—A of FIG. 12(a). Each upper electrode is connected to a transverse interconnection wire and grounded. The source electrode and drain electrode of the transistor 12 are connected to wires 14 and 15, respectively, to transfer detected signals to a signal processing circuit. Similarly, each infrared detecting element 5 when formed of a resistor film may be connected to each transistor 12.

The transistor 12 is disposed adjacent each detecting element 5 to process signals immediately, so that an effect appears of reducing noise.

EXAMPLE 6

Figure 13A:
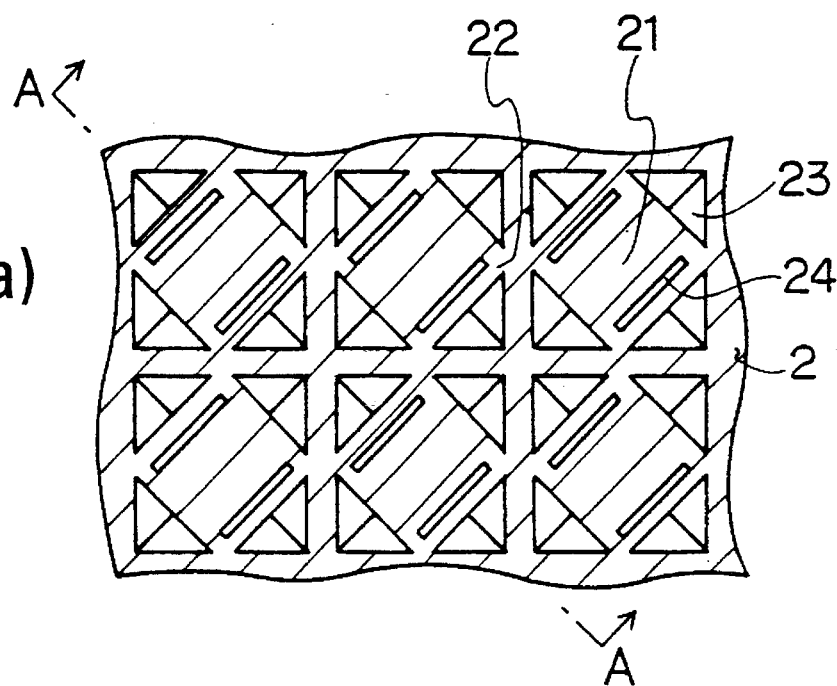
FIGS. 13(a) and 13(b) are explanatory views for illustrating the shapes of etched portions in a (100) silicon substrate and in an insulator film for the arrangement of infrared detecting elements according to the present invention.
Figure 13B:
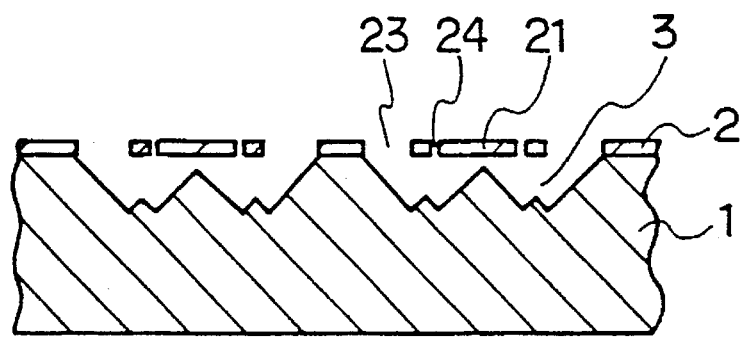

FIG. 13(a) is an explanatory plan view of the silicon substrate 1 in the state where the cavities 3 are defined but infrared detecting elements are not formed yet for according to another embodiment of the present invention; and FIG. 13(b) is an explanatory sectional view taken along line A—A of FIG. 13(a). In FIG. 13 numerals 1–3 and 21–23 denote corresponding parts of each of the aforementioned Examples. Numeral 24 denotes an opening portion in the form of a slit provided in each detecting element forming portion 21.

In this Example, as in Example 4, the insulator film 2 may be formed of either a silicon nitride film or a silicon oxide film. Photoresist is applied onto the insulator film 2 formed on the silicon substrate 1, then triangular portions defined between a {111} and {100} planes of the silicon substrate 1 at four corners of a quadrangle aligned with a {111} plane and portions of two parallel slits 24 are removed by the aforementioned method. Using the remained photoresist as a mask, the insulator film is etched with a mixed aqueous solution of hydrofluoric acid and ammonium fluoride. The insulator film 2 having right-angled triangular opening portions 23 and slits 24 thus defined is used as a mask for etching in the silicon substrate 1 as in Example 4. As a result, etching through the triangles and slits form cavities 3 in the shape of overlapped pyramids defined by a {111} plane. The cross-shaped silicon substrate 1 shown in FIG. 8 does not remain under each detecting element forming portion 21 of the insulator film 2, and each detecting element forming portion 21 is suspended by the lattice part 4 of the silicon substrate 1 at the bridge parts 22.

EXAMPLE 7

In Examples 4 to 6, the cavity 3 is provided on the {100} silicon substrate 1 in the following manner. The opening portions 23 and 24 are first etched by employing photolithography or like means in the insulator film 2 remaining only the required portions thereof on the silicon substrate, then the silicon substrate 1 is anisotropically etched using the etched insulator film 2 as a mask, and further isotropic etching is added as required.

Figure 14:
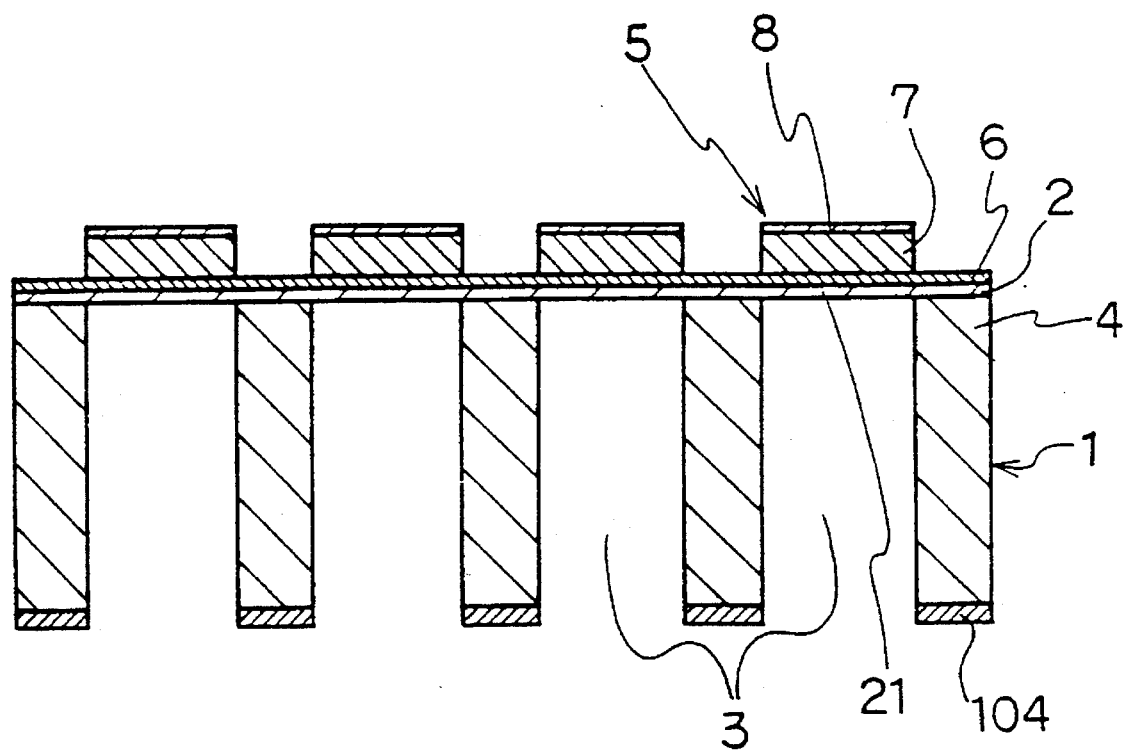
FIG. 14 is an explanatory view illustrating another embodiment of a pyroelectric-type infrared detecting element array according to the present invention.

In addition to the aforementioned etching manners the silicon substrate 1 can be etched from the reverse side thereof in this Example. Specifically, FIG. 14 is an explanatory sectional view of one embodiment of an infrared detecting element according to the present invention, and wherein numeral 1 denotes a silicon substrate having a {110} plane as a main surface and the lattice part is shown of the silicon substrate 1 remaining after etching. In this Example etching is carried out up to the insulator film 2 and, hence, the silicon substrate 1 is turned into a lattice-like skeleton with the cavities 3 under the insulator film 2. The infrared detecting element 5 comprising lower electrode 6, pyroelectric film 7 and upper electrode 8 is formed on the detecting element forming portion 21 defined in the insulator film 2 covering the cavity 3, and an alkali-proof film 104 is provided on the reverse side of the silicon substrate as a mask used in etching.

Figure 15A:
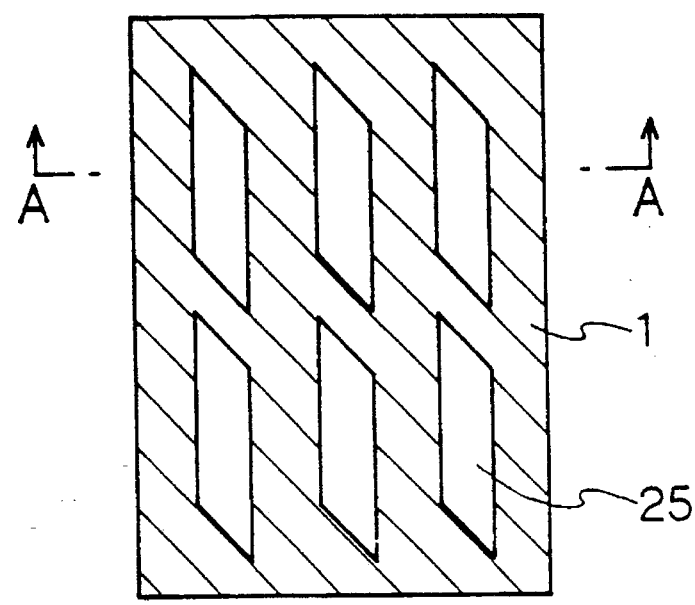
FIGS. 15(a) and (b) are explanatory bottom views of FIG. 14.
Figure 15B:
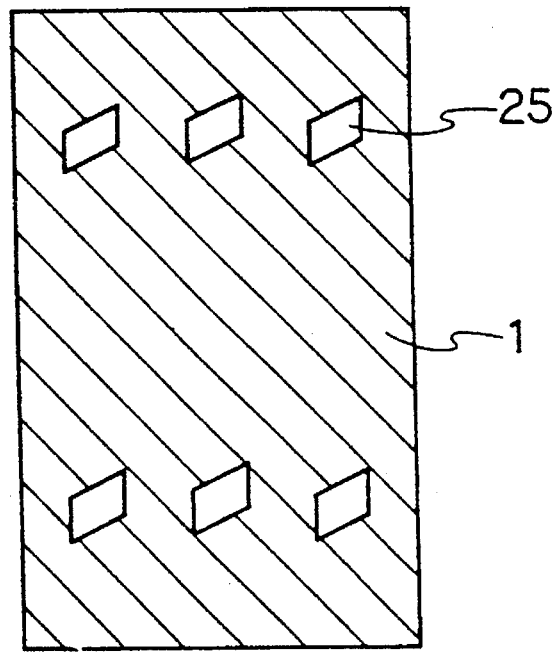

Further, FIG. 15(a) is an explanatory view showing the state of the silicon substrate 1 with the lattice part 4 comprising the lattice-like skeleton shown in FIG. 14 viewed from the opposite side of the detecting elements is formed; and FIG. 15(b) is a view showing the shape of each etched portion of the silicon substrate immediately under the insulator film on the element side. FIG. 14 is an explanatory view taken along line A—A of FIG. 15.

The cavity 3 as shown in FIG. 14 is etched anisotropically in the reverse side of the silicon substrate 1 formed with a pyroelectric film 7.

In this case, since the silicon substrate having a main surface in a {110} plane is etched anisotropically, the silicon substrate of a commercially available (110) silicon wafer should be etched vertically in a rhombic portion defined by four {111} planes at an angle of 55° relative to the orientation flat {100} plane. However, a {111} plane at an angle, of 35° relative to a {110} plane comes out at the two acute-angled vertexes of the rhombic portion, so that the etched portion may be in the shape of an upside-down roof. Therefore, because of the rhomboids shape of the opening 25 on the reverse side of the substrate 1 as shown in FIG. 15(a), the space between adjacent tranversely arranged detecting elements can be narrowed. Nevertheless, this etching widens the space between adjacent longitudinally arranged detecting elements under the silicon oxide film on the element forming side as shown in FIG. 15(b), since slopes are formed from the vertexes. The shape of each etched portion under the silicon oxide film on the element side may be hexagonal depending on the aspect ratio of the rhomb. It is, accordingly, possible to construct a two-dimensional array which requires many elements to be arranged in one direction.

First, an alkali-proof film is formed on the reverse side of the silicon substrate having a transparent insulator film of silicon oxide formed on the top. Photoresist is applied onto the alkali-proof film, subjected to an exposure through a mask, and etched. Using the photoresist as a mask, the alkali-proof film is etched and, in turn, the alkali-proof film is used as a mask for etching anisotropically in the silicon-substrate. As the aforesaid alkali-proof film is used a film of gold as well as of nitrogen oxide or silicon oxide. The etchant for the anisotropic etching is preferably an alkaline liquid. For example, an aqueous solution of KOH (40% by weight) heated at 80° C. is used, the ratio of etching rates of {110} plane/{111} plane is 600/1. Therefore, if a 0.2 mm-thick silicon substrate having a {110} main surface and a mask having parallelogrammatic windows each having one side aligned with a {111} plane are used, etching proceeds vertically to a {110} plane at respective sides of each parallelogrammatic window. In this portion, when etching reaches the silicon oxide insulator film, the substrate is laterally etched to about 0.3 μm. Since the etchant contacts the substrate on the opposite side of the elements, uniform etching can be assured and, further, it is easy to wash the etchant away in cleaning.

The cavity 3 is etched so as to reach the silicon oxide film 2 lying under each of the infrared detecting elements arranged on the silicon substrate 1, and the retained portion of the silicon substrate 1 defines the lattice part 4 comprising a lattice-shaped skeleton, as shown in FIGS. 14 and 15.

Figure 16A:
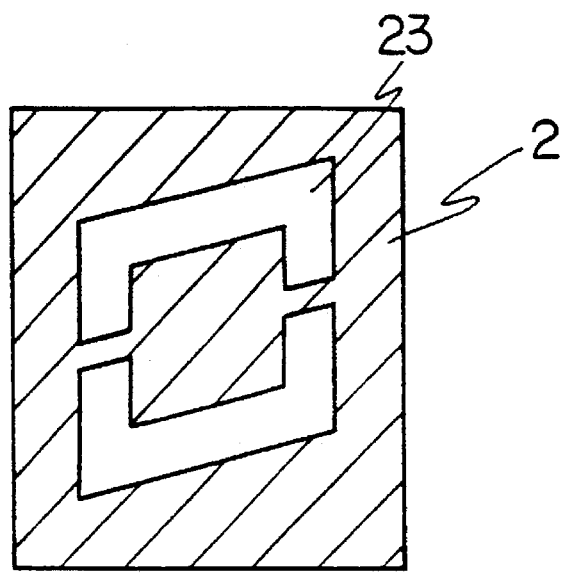
FIGS. 16(a) and (b) are explanatory views for illustrating the shape of a through-hole defined in an insulator film in one embodiment of an infrared detecting element array according to the present invention.
Figure 16B:
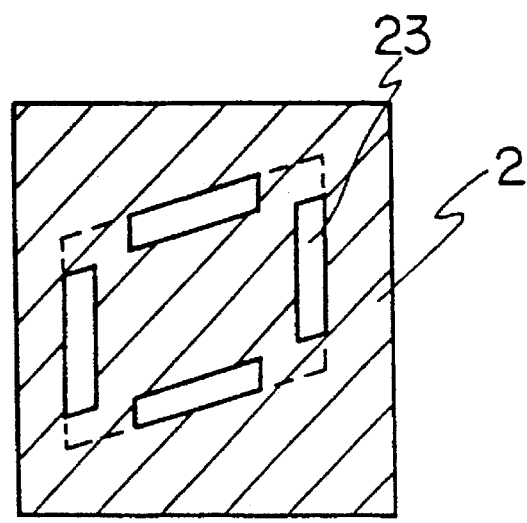

In the infrared detecting element array of the present Example it is possible that the silicon oxide insulator film 2 define an opening portion while each cavity 3 reaches the silicon oxide insulator film of each infrared detecting element. FIG. 16 is an explanatory view showing one portion of the silicon substrate 1 provided with the insulator film 2 having opening portions 23, and wherein denoted at numeral 2 is the silicon oxide insulator film and at numeral 23's are opening portions defined in the insulator film. Further, the dotted line indicates the quadrilateral cavity etched under the silicon oxide insulator film 2 in the silicon. Although examples of the shape of the opening portions 23 are shown in FIGS. 16(a) and 16(b), the shape of the opening portions 23 is not limited to these examples and may be in any other form in the present invention.

In this way the opening 23 in the silicon oxide insulator film 2 gives more space between the infrared detecting element and the substrate, which prevents the heat applied to any infrared detecting element to be transferred to the adjacent elements and helps etching and succeeding washing to be carried out easily.

While a silicon oxide film is used as the insulator film in the foregoing description, the use of an insulator film that is transparent per se and alkali-proof would advantageously permit infrared detecting elements to be formed on the insulator film with easy alignment. Examples of preferred insulator films include silicon nitride and the like as well as silicon oxide.

As one example of the method of forming infrared detecting elements is used a method of forming a film through a mask of a thin metal sheet defining openings. Specifically, a metal electrode layer is formed using the mask defining openings. In this case a pattern that is too minute to define with the metal mask is defined by etching or lift-off method. In turn, a pyroelectric film or a resistor film is formed through the metal mask. In the case of the pyroelectric film, the upper electrode 8 is further formed through the metal mask or by etching or lift-off method.

EXAMPLE 8

FIG. 17 is an explanatory sectional view showing another mode of the connection between infrared detecting elements 5 and signal processing circuits. Specifically, an example is shown in which signals from each infrared detecting element 5 formed in the detecting element forming portion 21 having a {110} plane according to the method described in Example 7 are adapted to be coupled to signal processing transistor 18 through each bump 19 of low-melting-point metal formed on the lattice part 4 of the silicon substrate 1. FIG. 17(a) illustrates the case where a pyroelectric film is used, and FIG. 17(b) illustrates the case where a resistor film is used. In either case infrared rays may come in from the reverse side of the silicon substrate 1 on which the infrared detecting array is formed. In FIG. 17(a), numeral 1 denotes the silicon substrate 1, numeral 2 the insulator film, numeral 3 the cavity, numeral 6 the lower electrode, numeral 7 the pyroelectric film and the numeral 8 the upper electrode. Numeral 19 denotes the bump of low-melting-point metal which lies in a portion of the lattice part where the electrode 8 is connected through the bridge part. Further, numeral 18 denotes the signal processing transistor adapted to receive signals from the pyroelectric film through the bump 19. In FIG. 17(b) numerals 9 and 10 denote the parallel electrodes, numeral 11 the resistor film, and the bump 19 of low-melting-point metal lies in a portion where the electrode 9 is connected to the lattice part 4 of the silicon substrate 1 through the bridge part. Signals from the resistor film 11 are input to the signal processing transistor 18 through this metal bump 19.

In the present Example the signal processing transistor 18 is formed on a substrate separate from the substrate provided with the infrared detecting elements 5, and is connected to each infrared detecting element 5 through the bump 19, whereby the signal processing transistor is protected from contamination, resulting in the improved yield. Further, in the present Example the connection portion comprising the bump 19 is provided in the lattice part 4 and, hence, the mechanical strength of the device is enhanced and the connection can assuredly be made. In addition, since the infrared detecting element portion 5 is isolated by the bridge part, the heat of each infrared detecting element will never escape through the bump 19.

It should be noted that where the substrate is formed of a material other than silicon which has a refractive index as small as, for example, 1.5 in the infrared region and further in the shape shown in FIG. 9 or FIG. 13, the method described in Example 6 in which the bump is formed in the lattice part is an effective means since infrared rays may come in from the reverse side of the substrate 1 to each detecting element through the cavity 3.

As has been described, according to the present invention an infrared detecting element array is formed on a silicon substrate and, hence, the silicon technology can be utilized to reduce in element size and give an effect of forming a multiplicity of elements at a high density.

Further, according to the present invention a silicon substrate is shaped like a lattice, a cavity is defined under an insulator film enclosed by the lattice and an infrared detecting element is formed on the insulator film; or a silicon substrate is formed into a thin layer, a flat portion and a narrow bridge part are defined in the thin layer and an infrared detecting element is formed on the flat portion. Hence, an infrared detecting element array according to the invention advantageously has a small heat capacity and little heat transfer between adjacent elements.

Still further, the formation of an infrared detecting element array on a silicon substrate allows a signal processing transistor to be formed adjacent an infrared detecting element. Also, in the case where the signal processing transistor of silicon is coupled to the infrared detecting element array through a metallic bump, an effect is given such that a highly reliable device with less strain can be obtained since the signal processing transistor has a thermal expansion coefficient equal to that of the infrared detecting element array.

What is claimed is:

1. An infrared detecting element array comprising:

a plurality of infrared detecting elements which are two-dimensionally arranged over a semiconductor substrate, a plurality of cavities each underlying a respective one of the infrared detecting elements;

a lattice comprising at least a layer of an insulator two-dimensionally and continuously disposed on an isolating insulator film over the semiconductor substrate, said lattice comprising frames, each frame enclosing a respective one of said cavities; and an insulating film of a uniform thickness continuously disposed over the semiconductor substrate, the insulating film comprising first portions in contact with lower surfaces of said infrared detecting elements, wherein each of said first portions of said insulating film is connected to second portions of said insulating film in contact with the lattice, the first portions being suspended above said respective one of said cavities by means of bridge parts made up of remaining portions of said insulating film.

2. The infrared detecting element array of claim 1, wherein said first portions of said insulating film share a common plane with an upper surface of said second portions of said insulating film.

3. The infrared detecting element array of claim 1, further comprising transistors for signal processing, each transistor connected to and disposed adjacent to a respective one of said infrared detecting elements, and longitudinally and transversely extending interconnection wiring films provided to the transistors for selectively driving the transistors.

4. The infrared detecting element array of claim 1, wherein said infrared detecting elements are each connected both to a respective transistor for signal processing and to one of a plurality of devices for scanning respectively disposed on said semiconductor substrate at a location adjacent an end of each row or column of said infrared detecting elements.

5. The infrared detecting element array of claim 1, wherein each of said infrared detecting elements is electrically connected to a respective transistor for signal processing by way of a bump of a low-melting-point metal disposed on a skeleton of said lattice part.

6. A method for fabricating an infrared detecting element array, comprising the steps of:

forming a substrate isolating insulator film on a semiconductor substrate;

forming on the substrate isolating insulator film a plurality of dummy film portions disposed two-dimensionally;

forming a lattice film on a surface of the substrate isolating insulator film at locations on which the dummy film portions are absent, thereby defining a lattice part;

forming an insulating film on the dummy film portions and the lattice part;

forming infrared detecting elements, each comprising an electrode film and an infrared detecting element film on the insulating film at locations coincident with each of the dummy film portions;

defining openings in the insulating film at locations whereon the infrared detecting elements are not formed, the openings extending through the insulating film to each respective dummy film portion; and removing the dummy film portions through the openings to define a respective cavity under each infrared detecting element.

* * * * *